(12) United States Patent
Moslehi

(10) Patent No.: US 6,209,480 B1
(45) Date of Patent: Apr. 3, 2001

(54) HERMETICALLY-SEALED INDUCTIVELY-COUPLED PLASMA SOURCE STRUCTURE AND METHOD OF USE

(76) Inventor: Mehrdad M. Moslehi, 956 Stanley Ave., Los Altos, CA (US) 94024

( * ) Notice: Subject to any disclaimer, the term of this patent is extended or adjusted under 35 U.S.C. 154(b) by 0 days.

(21) Appl. No.: 08/677,849

(22) Filed: Jul. 10, 1996

(51) Int. Cl.$^7$ .................................................. C23C 16/507
(52) U.S. Cl. .................................. 118/723 I; 118/723 R; 216/67; 216/71
(58) Field of Search .................... 156/345 C; 118/723 I, 118/723 IR; 204/298.34

(56) References Cited

U.S. PATENT DOCUMENTS

| | | | |
|---|---|---|---|
| 4,948,458 | 8/1990 | Ogle | 156/643 |
| 5,231,334 | 7/1993 | Paranjpe | 315/111.21 |
| 5,354,443 | 10/1994 | Moslehi | 204/192.12 |
| 5,397,962 | 3/1995 | Moslehi | 315/111.51 |
| 5,435,881 | 7/1995 | Ogle | 156/345 |
| 5,522,934 | * 6/1996 | Suzuki et al. | 118/723 AN |
| 5,580,385 | * 12/1996 | Paranjpe et al. | 118/723 I |
| 5,800,618 | * 9/1998 | Niori et al. | 118/723 E |

OTHER PUBLICATIONS

Properties of Multi–Spiral Coil ICP Source, T. Okumura, I. Nakayama and Y. Yanagi.
Watkins, R.D., Types of Ceramic Joinings and Their Uses, Engineered Materials Handbook, V.4, 478–481, Dec. 1991.*
Mizuhara,H., Oyama, T., Ceramic/Metal Seals, Engineered Materials Handbook, V.4, 502–510, Dec. 1991.*
Tomsia, A.P., Pask, J.A., Loehman, R.E.,Watkins, R.D., Glass/Metal and Glass–Ceramic/Mertal Seals, Engineered Materials Handbook, V.4, 494–501, Dec. 1991.*

* cited by examiner

Primary Examiner—Gregory Mills
Assistant Examiner—Rudy Zervigon
(74) Attorney, Agent, or Firm—Gray Cary Ware & Freidenrich

(57) ABSTRACT

A multi-zone high-density inductively-coupled plasma source includes a first individually controlled RF antenna segment for producing a plasma from a process gas. A second individually controlled coil segment is included in the ICP source for producing a plasma from a process gas. In various embodiments, more than two sets of individually controlled coil segments may be used. In one embodiment, a separate power supply may be used for each coil segment individually.

Another aspect of this invention is a hermetically-sealed inductively-coupled plasma source structure and method of fabrication which eliminates the possibility of process contamination, improves the source hardware reliability and functionality, and improves the vacuum integrity and ultimate base pressure of the plasma system.

47 Claims, 14 Drawing Sheets

HERMETICALLY-SEALED INDUCTIVELY-COUPLED PLASMA SOURCE STRUCTURE AND METHOD OF USE

TECHNICAL FIELD OF THE INVENTION

This invention relates generally to plasma processing methods and systems, and more particularly to an apparatus and method for hermetically-sealed inductively-coupled plasma generation source structure for plasma-assisted fabrication processes used for manufacturing of semiconductor, data storage, flat-panel display, photovoltaic, and multi-chip module devices, and method for manufacture of same.

BACKGROUND OF THE INVENTION

Plasma processes are used for numerous fabrication steps in various device manufacturing applications such as semiconductor integrated circuit, data storage device (heads and media), and flat-panel display manufacturing. Typically, plasma processes (also known as plasma-enhanced or plasma-assisted processes) are used for physical-vapor deposition (PVD), plasma-enhanced chemical-vapor deposition (PECVD), dry etching, wafer cleaning (or surface preparation), in-situ chamber cleaning, and plasma-immersion ion implantation (also known as plasma doping) applications. Conventional or prior art methods of plasma generation employ one or a combination of several techniques. Various plasma generation techniques include parallel-plate capacitive discharge, microwave discharge (including electron cyclotron resonance or ECR plasma), hollow cathode discharge, and inductively-coupled plasma (ICP) sources.

The high-density inductively-coupled plasma or ICP sources have recently received a significant amount of attention due to their superior process performance, throughput rate, and control capabilities. ICP sources can provide high-density ($n_p$ values ranging from $1 \times 10^{11}$ cm$^{-3}$ to over $5 \times 10^{12}$ cm$^{-3}$) plasmas using fairly simple inductive radio frequency (RF) excitation. Advanced ICP source designs are capable of producing fairly high plasma densities (corresponding to the plasma electron density or $n_p$) even larger than $1 \times 10^{13}$ cm$^{-3}$. The RF source frequency is typically in the range of 1 to 30 MHZ (with a preference for 13.56 MHZ). RF frequencies in the low end of this range result in reduced induced RF voltages across the ICP antenna. This reduces the risk of capacitive coupling as well as sputtering of the inner process chamber and ICP source walls near the ICP antenna. Lower ICP source frequencies, however, result in reduced plasma densities and larger RF matching network components. On the other hand, higher RF frequencies can provide superior plasma densities and can be effectively coupled to the plasma load using more compact RF matching network components. However, precautions must be taken to ensure that no chamber wall sputtering occurs due to the relatively high induced RF voltages that arise across the antenna. Higher induced RF voltages across the ICP source antenna can increase the risk of capacitive coupling and raising the plasma potential.

One advantage of ICP over conventional parallel plate plasma is its ability to control the plasma density and ion energy (for the ion flux arriving at the substrate in process) independent of each other. The plasma density is primarily controlled by the applied RF current or power delivered to the ICP source antenna, whereas the mean ion energy control is performed by an applied RF bias to the substrate or wafer. The substrate may be a semiconductor wafer (e.g., silicon), a data storage substrate (AlSiMag or AlTiC), a photovoltaic substrate (e.g., polysilicon or silicon), or a flat-panel display substrate (e.g., glass).

Various types of ICP source designs have been proposed in prior art. These include spiral coil antenna designs, helicon wall source designs, and cylindrical coil antenna source designs. However, all the prior art ICP designs share a common constraint or limitation which makes them unable to control or adjust the plasma uniformity profile in real time. The prior art ICP sources are primarily based on single-zone designs and employ single-coil antenna structures with a single RF plasma excitation source. The basic prior art designs mostly employ either a cylindrical or cone-shaped coil around a quartz chamber (such as a quartz bell jar) to generate a large-volume plasma or a planar spiral coil above a dielectric plate (outside the vacuum chamber) to generate a so-called planar plasma. The spiral coil ICP design often uses a flat spiral coil, but provides the options to contour the surface topography of the ICP antenna dielectric housing and/or the antenna coil itself for improved plasma uniformity.

The spiral coil design possesses certain technical advantages, but also has serious limitations. The spiral coil design allows placement of the antenna above a vacuum dielectric plate on the atmospheric side or within the vacuum chamber using an epoxy encapsulation. One can provide a capability to reduce the induced RF voltage across the spiral coil by placing a few capacitors in series with the spiral coil loops. This is not a trivial implementation task since the antenna coil is usually made of water-cooled aluminum or copper tubing. Insertion of the series capacitors may require breaking the tubing water flow by insertion of an in-line metal-to-ceramic insert. Unfortunately, this results in added structural complexity and increased equipment cost. The ICP sources with cylindrical coils around the electrically insulating plasma source or process chamber require an electrically insulating process chamber or plasma source wall material such as quartz tube or aluminum oxide tube used in some source designs such as the helicon plasma sources. These bulk ICP sources can suffer from plasma non-uniformity problems and usually require a multipolar magnetic bucket inserted between the plasma source chamber and the process environment to generate an expanded uniform plasma. This, however, results in reduced processing throughput due to reduced plasma density and ion flux density at the substrate. Moreover, these sources may generate contaminants and particulates due to sputtering of the plasma source chamber wall material near the excitation RF antenna.

The ICP coil is usually driven by a 13.56 MHZ RF source. The RF current also induces an RF voltage across the antenna coil. In order to eliminate any electric field induced arcing or chamber sputtering, the amount of induced RF voltage must be minimized. This condition places a limit on the maximum allowable excitation coil inductance or the number of coil turns. Moreover, for a given coil design (e.g., a given number of turns or inductance) there is an upper limit on the maximum allowable RF source frequency. In addition, for a given conventional ICP source design and a specified excitation RF frequency (e.g., 13.56 MHZ), there is a limit on the maximum allowable RF power delivered to the ICP antenna in order to ensure minimal chamber or plasma source wall sputtering and reduced process contamination. The prior art designs for ICP coils, therefore, mostly suffer from plasma process nonuniformity problems, are not easily scalable for larger wafer processing, and have a relatively narrow useful process window (in terms of RF power, pressure, etc.). The conventional ICP designs do not provide any direct method of real-time plasma uniformity control without compromising the significant process state or substrate state parameters.

Advanced plasma fabrication processes require excellent plasma density and ion flux uniformity control over the entire wafer surface. Plasma uniformity requirements in high-density plasma sources are dictated by both process uniformity requirements and device damage considerations. Typically, the plasma nonuniformity must be less than 5% (3-sigma value) to ensure damage-free uniform processing. Many conventional ICP source designs fail to meet these stringent process uniformity requirements for various plasma processing applications.

SUMMARY OF THE INVENTION

In accordance with the present invention, a method and system for creating an inductively-coupled plasma (ICP) environment for various device fabrication applications is provided that substantially eliminates or reduces disadvantages and problems associated with previously developed ICP processing methods and systems. The ICP processing method and system of this invention is applicable to manufacturing of semiconductor, data storage, flat-panel display, and photovoltaic devices.

According to one aspect of the invention, there is provided a multi-zone high-density inductively-coupled plasma source structure and method of use that includes a first individually controlled inductive coil for producing a first plasma zone from a process gas. A second individually controlled coil is included in the ICP source for producing a second plasma zone from a process gas. In various embodiments, more than two individually controlled inductive coils may be used. In one embodiment, a separate RF power supply may be used for each ICP coil zone. Each ICP coil zone may be made of either a single coil segment or a set of coil segments interconnected using at least one series capacitor.

Another aspect of the present invention is a hermetically-sealed ICP source structure and fabrication method that are applicable to both the multi-zone ICP structure of the present invention as well as the conventional single-zone ICP structures. By forming the ICP antenna and its encapsulation housing as a single hermetically-sealed structure, the present invention eliminates the need for various seals and encapsulations for the ICP excitation antenna and associated housing. Moreover, the monolithic ICP structure and fabrication method of this invention provide better ICP structural integrity, plasma source reliability, and vacuum integrity in the process environment.

In the multi-zone ICP source of this invention, the RF current magnitude (and phase) can be adjusted in each zone independently The multi-zone ICP source design of this invention offers several advantages over the conventional single-zone designs. These include (1) significantly improved plasma uniformity (plasma density and ion current density) as a result of the features provided for real-time uniformity control; (2) a much wider process window due to the multi-zone plasma adjustment capability; (3) increased plasma density and ion flux density; (4) a design that is scalable for large substrate processing (such as for 300-mm or larger silicon wafers and flat-panel display substrates); (5) a lower number of coil turns per zone to ensure that no electric field induced arcing or sputtering of the chamber and plasma source wall material occurs; (6) a capability for real-time or run-by-run control of plasma process parameters including uniformity using suitable in-situ monitoring sensors; (7) improved manufacturing equipment cleanliness for enhanced device manufacturing yield; (8) increased plasma process throughput; and (9) improved plasma equipment reliability and process repeatability/performance due to improved ICP source integrity.

The multi-zone ICP source design is applicable to manufacturing of semiconductor devices, data storage devices, photovoltaic devices, and flat-panel displays. Selection of the number of ICP zones depends on several parameters and considerations including ICP source diameter, substrate size, source design type, maximum total RF power, and plasma process throughput requirements. For most of the practical applications semiconductor processing, the number of the ICP source zones may be two to four, however, greater number of zones may be desirable for different applications such as those for very large-area substrate processing. For instance, a two-zone ICP source (antenna) design may be used to adjust the relative edge-to-center plasma process uniformity in a plasma equipment used for processing of 150-mm or 200-mm semiconductor wafers. An ICP source design with two to five excitation zones may be used for processing of 200-mm and 300-mm silicon wafers.

A technical advantage of the present invention therefore, is that it provides multi-zone high-density plasma source structure using at least two individually controlled coil segments for uniform plasma processing. The multi-zone ICP source structure of this invention may be constructed either using the more conventional ICP source fabrication and assembly methods (i.e., at least two cooled or temperature-controlled coils placed either outside the process chamber adjacent to a dielectric vacuum plate or encapsulated in an electrically insulating housing inside the ICP vacuum process chamber), or using a hermetically-sealed antenna structure placed within the vacuum environment.

Another technical advantage of the present invention is that it provides a hermetically-sealed ICP source fabrication structure and method that are applicable to both the conventional single-zone ICP structures as well as the multi-zone ICP source structure of this invention. This novel method and structure eliminates the need for elastomer O-ring seals and separate ICP antenna epoxy encapsulation by providing a high-integrity ICP source structure compatible with the ultrahigh vacuum (UHV) base pressure requirement of $5 \times 10^{-9}$ Torr or less.

Yet a further technical advantage of the present embodiment is an in-situ sensor view port design which can be used for implementation of some useful plasma state and wafer state sensors such as full-wafer interferometry sensor and a spatially resolved optical emission sensor. The full-wafer-view optical port uses a hermetically sealed optical (e.g., sapphire or quartz) window or plug located at the center of the ICP source. This port enables real-time (or run-by-run) plasma process uniformity control using the multi-zone ICP source design of this invention in conjunction with a process uniformity monitoring sensor (such as a full-wafer interferometry sensor).

The hermetically-sealed aspect of the present invention provides an important technical advantage by eliminating elastomer seals by replacing them with hermetic seals that provide improved process cleanliness, enhanced vacuum integrity, and improved source lifetime.

The hermetically-sealed aspect of the present invention provides another technical advantage by providing low thermal resistance heat transfer junctions to allow cooling of the ICP housing by a portion of the present invention.

The hermetically-sealed aspect of the present invention provides another technical advantage by greatly reducing or eliminating the possibility of outgassing.

The hermetically-sealed aspect of the present invention provides yet another technical advantage by increasing ICP source reliability, extending the ICP source lifetime and enhancing process cleanliness resulting in a reduces cost of ownership while enabling high-performance plasma processing

BRIEF DESCRIPTION OF THE DRAWINGS

For a more complete understanding of the present invention and the advantages thereof, reference is now made to the following description which is to be taken in conjunction with the accompanying drawings in which like reference numerals indicate like features and wherein.

DETAILED DESCRIPTION OF THE INVENTION

Preferred embodiments of the present invention are illustrated in the FIGUREs like numerals being used to refer to like and corresponding parts of the various drawings.

The embodiment of the present invention that FIGS. 1 through 4 describe is a hermetically-sealed multi-zone (HMZ) ICP source for various high-density plasma applications, including plasma etch, PECVD, surface cleaning, plasma hydrogenation, and other plasma-assisted fabrication processes. The concepts of the present invention apply not only to a two-zone ICP source, but also to a multi-zone source with any number of ICP excitation zones (2, 3, 4, and more). Moreover, the preferred embodiment of this invention is for implementation of the HMZ ICP source inside the ICP vacuum process chamber in order to eliminate the need for a dielectric vacuum window and to enable implementation of an all-metal-seal ICP source and process chamber for improved vacuum integrity by reducing the chamber vacuum base pressure. It is, however, understood that the HMZ ICP source of this invention can also be implemented outside the vacuum chamber using a dielectric vacuum window for separating the source from the process chamber.

The HMZ ICP source of FIGS. 1 through 4 provides a design in conjunction with a six-zone showerhead gas injector. The HMZ ICP source, however, is also compatible with the use of either a single-zone showerhead or a multi-zone showerhead with any number of independently controlled showerhead zones (e.g., from one to ten zones). Some applications such as surface cleaning may require only a single-zone showerhead while other applications such as PECVD may benefit from using multiple showerhead zones for improved process uniformity control via multi-zone gas flow adjustment. The multi-zone showerhead feature allows radial control of the process gas mass transport profile which is particularly useful for uniform PECVD applications. Moreover, using the multi-zone showerhead, the source can be used for injection of multiple gases without premixing the gases. As a result, mixing of multiple gases occurs in the plasma process environment and not inside the delivery gas lines or inside the ICP source. Separation of multiple process gases, such as in a binary gas system in CVD applications, can eliminate the possibility of gas phase nucleation and particulate generation inside the showerhead. For instance, in a PECVD process used for silicon dioxide deposition, the process gas system may comprise $SiH_4$ and $N_2O$. Using the multi-zone showerhead arrangement of this invention, these gases can be separated and injected as a binary system into alternating adjacent showerhead zones.

Figure 1:
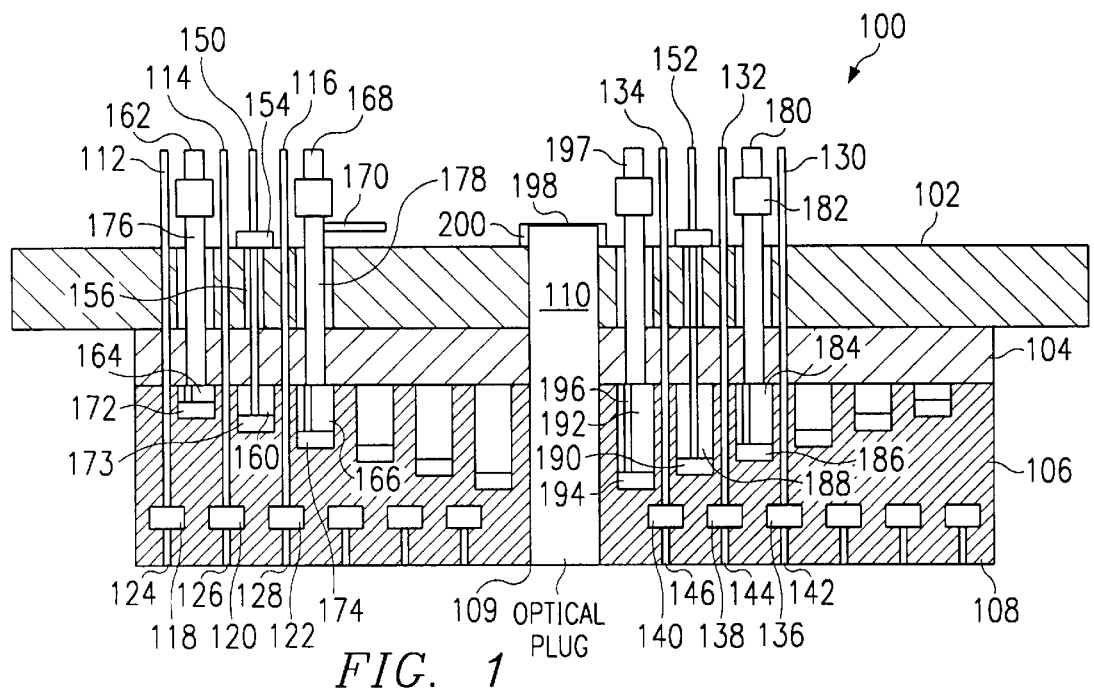
FIG. 1 shows a cross-sectional view of a first embodiment of the multi-zone ICP source of present invention configured as a two-zone ICP source.

With this introduction, more particular attention is now drawn to FIG. 1. FIG. 1 shows HMZ ICP source 100 that includes water-cooled or temperature-controlled metallic top vacuum plate 102, which may be formed of stainless steel or aluminum, that adjoins top dielectric plate 104. Top dielectric plate 104 is hermetically sealed or bonded to middle dielectric plate 106 which itself hermetically bonds to showerhead injector plate 108. Optical plug (or window) 110 passes through metallic top plate 102, top dielectric plate 104, middle dielectric plate 106, and showerhead injector plate 108, and provides an optical viewport to the entire wafer surface throughout the fabrication process. The optical viewport can also be used for monitoring of the plasma process parameters using a suitable optical sensor, such as spatially resolved plasma emission sensor.

Metallic top plate 102 includes numerous feedthroughs or penetrations, some of which are for coolant (e.g., water) flow purposes, some are for ICP gas injections, and the remaining ones are for electrical RF feedthroughs. For example, the first set of showerhead gas inlets 112, 114, and 116 pass through metallic top plate 102, are bonded to the holes within the top dielectric plate 104, and feed into the holes within the middle dielectric plate 106 in order to inject the process gases into respective showerhead zone dispersion cavities 118, 120, and 122. Showerhead zone cavities 118, 120, and 122 direct process gases to the rings of injection holes 124, 126, and 128 of showerhead injector plate 108. Likewise, showerhead inlets 130, 132, and 134 also pass through metallic top plate 102, are bonded to holes within the top dielectric plate 104, and feed into the holes within the middle dielectric plate 106 in order to inject the process gases into respective showerhead zone dispersion cavities 136, 138, and 140. From the associated showerhead zone cavities 136, 138, and 140, plasma process gases pass through and out of several rings of gas injection holes 142, 144, and 146 of showerhead injector plate 108.

Also penetrating through vacuum base plate 102 are a plurality of electrical RF feedthroughs including RF feedthroughs 150 and 152. RF feedthrough 150, for example, connects through RF feedthrough connection 154, passes through channel 156 of metallic top plate 102, continues through top dielectric plate 104, and continues into cooling water channel 160 of middle dielectric plate 106 until it contacts ICP antenna RF coil segment 173 (which is part of a two-zone HMZ ICP source 100 arrangement).

Hermetically-sealed ICP source 100 includes two zones of cooling (such as water cooling) to remove heat generated by the ohmic power losses due to RP power delivery and ICP plasma generation process. The first zone includes inlet channel 162 that passes through metallic top plate 102 and is bonded to the top dielectric plate 104 for providing cooling water to cooling water channel 164 of middle dielectric plate 106. Middle dielectric plate 106 provides internally a cooling path by which water may enter, for example, cooling channel 164, pass through to cooling channels 160 and ultimately enter cooling channel 166. From cooling channel 166, cooling water exits from the ICP source through outlet 168. Outlet 168 receives the cooling water from the zone 1 cooling channels and permits continuous flow of cooling water from cooling water inlet 162 through cooling channels 164, 160, and 166 with a continuous heat removal action. In the first zone of hermetically-sealed ICP source 100, zone-1 RF contact 170 provides a path by which an RF current may flow through each of plated (or molded or inserted) coil segments 172, 173, and 174 of zone-1.

In completing the description of hermetically-sealed ICP source 100 as depicted in FIG. 1, in metallic top plate 102 are cooling channel feedthroughs for receiving cooling water including cooling channel 176 connected to zone-1 inlet channel 162 (via an in-line insulating ceramic tube insert), and cooling channel 178 connected to zone-1 outlet channel 168 (via an in-line insulating ceramic tube insert for electrical isolation). Cooling water inlet 180 connects to in-line insulating ceramic tube insert 182 for providing cooling water to cooling channel 184 of zone-2 of hermetically-sealed ICP source 100 and its surrounding region. In middle dielectric plate 106, coolant passes to cooling water channel 188 for cooling coil segment 190 and its surrounding region. From cooling channel 188, cooling water flows in middle dielectric plate 106 to cooling channel 192 for cooling coil segment 194 of zone-2 of the hermetically-sealed ICP source and its surrounding region. The cooling water subsequently flows out of the zone-2 coils via coolant outline 197.

In middle dielectric plate 106, cooling water channels 164, 160, 166, 184, 188, and 192 have been shown with progressively greater depths. This configuration enables vertical contouring of respective coil segments 174, 173, 172, 186, 190, and 194. This ICP antenna contouring (convex or concave contouring) provide an additional design parameter to optimize the ICP uniformity performance. Showerhead 108 is made of an electrically insulating and thermally conductive material, preferably formed of a ceramic material such as aluminum nitride (AlN), aluminum oxide ($Al_2O_3$), or boron nitride (BN). Similarly, the top and middle dielectric plates 104 and 106 should be made of a suitable electrically insulating and thermally conducting material such as AlN, $Al_2O_3$, or BN. As appropriate, the contacting interfaces between the plates of hermetically-sealed ICP source 100 are hermetically bonded or fused (preferably using a thermal bonding process) or otherwise connected (such as with a high-temperature cured UHV-compatible epoxy) in order to establish a sealed ICP antenna encapsulation housing for ultraclean plasma processing. For example, metallic top vacuum plate 102 and top dielectric plate 104 are fused or hermetically bonded together using a thermal bonding (e.g, with indium) or epoxy bonding process. Top dielectric plate 104 and middle dielectric plate 106 are also bonded together at their contact interface junctions.

Similarly, middle dielectric plate 106 and showerhead injector plate 108 are also bonded together at their contact junctions. All four plates (metallic plate 102 and ceramic plates 104, 106, and 108) can be bonded together using a single thermal bonding process using indium or another suitable bonding or brazing material.

Optical plug 110 provides a viewpoint for probing or viewing the plasma process environment. On top of optical plug 110 is view port 198 which is connected or sealed (using a metal or wire seal) to metallic top plate 102 through hermetically sealed flange 200. The hermetically-sealed ICP source employs a water-cooled (or gas-cooled) metallic (stainless steel) top vacuum plate 102 to support the ICP source inside the plasma process chamber and to enable establishing a UHV base pressure of less than $1 \times 10^{-8}$ Torr. Metallic top plate 102 also provides all the necessary feedthroughs (RF, gas inlets, and cooling water inlets/outlets for the ICP coil channels), and provides a vacuum seal (e.g., using a metal seal) to the ICP process chamber. The metallic top vacuum plate 102 cooling may be performed either indirectly using the ICP source coolant (water) flowing through the coil channels in the ceramic housing, or directly using separate embedded cooling channels inside the metallic vacuum top plate 102 itself.

Hermetically-sealed ICP source 100 of the FIG. 1 embodiment, therefore, consists of two RF power sources (for a 2-zone ICP arrangement), 12 electrical RF feedthroughs for 6 coil segments and six pairs of electrical contacts, four coolant feedthroughs (including two inlets and two outlets), and six process gas inlets (assuming six injection zones). However, for the same two-zone ICP coil configuration of hermetically-sealed ICP source 100, the number of external coolant feedthroughs can be reduced to two by connecting the zone-1 and zone-2 water channels in series within the ICP ceramic housing middle dielectric plate.

Figure 2:
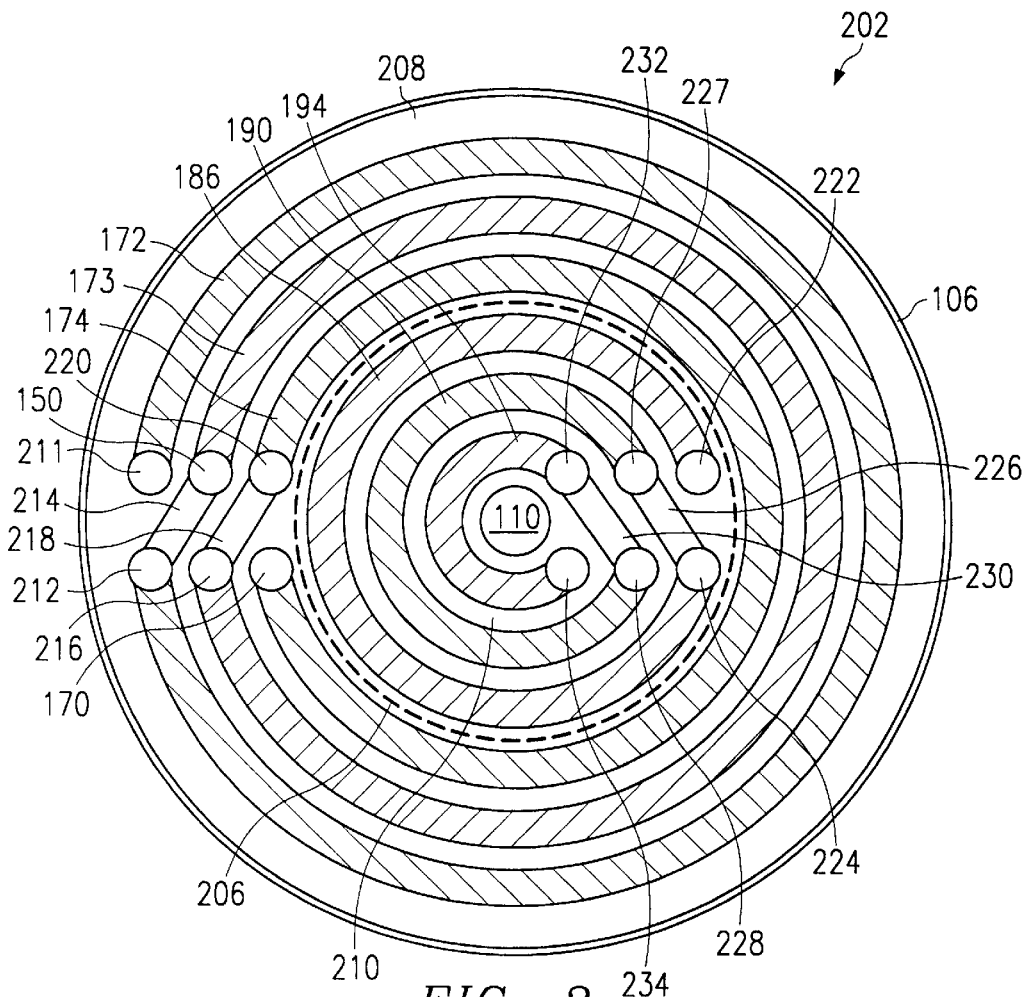
FIG. 2 provides a view of the two-zone inductively-coupled plasma antenna portion embedded in the middle ceramic ICP or dielectric plate for the FIG. 1 embodiment (first embodiment)

FIG. 2 shows a top view of the middle dielectric or ceramic insulator plate comprising the two-zone antenna configuration for ICP antenna 202 of the present embodiment. Multi-zone ICP antenna 202 is fabricated within middle dielectric plate 106 of hermetically-sealed ICP source 100. Middle dielectric plate 106 is made of a thermally conductive and electrically insulating material such as AlN, $Al_2O_3$, or BN. Formed in ICP source middle dielectric plate 106 are two RF antenna zones for ICP generation that are conceptually differentiated by dash line 206. For example, that portion of ICP antenna 202 outside of dash line 106 corresponding to the antenna segments 172, 173, and 174 forms the zone-1 antenna 208, while that portion within dash line 206 containing the antenna segments 186, 190, and 194 forms the zone-2 antenna 210.

As FIG. 2 further indicates, at the center of zone-2 antenna 210 appears the feedthrough hole for optical viewport plug 110. Zone-1 or outer zone antenna 208 begins with outer zone-1 RF contact 211 that connects to plated (or a combination of sputtered and plated, or inserted broken ring) coil segment 172 that was originally introduced in FIG. 1. The coil segment 172 is formed in a circular path as a broken ring and continues to RF terminal contact 212. The coolant groove 164 over outer zone coil segment 172 is connected in series to the adjacent outer zone coils segment 173 coolant channel 160 via jumper water channel 214 of middle dielectric plate 106. Connecting to unplated (electrically insulating) jumper water channel 214 is RF terminal contact 150 (FIG. 1) which also connects to ICP coil segment 173. ICP coil segment 173 is also formed as a broken ring and takes a circular path around middle dielectric plate 106 to connect to RF terminal contact 216. The coolant groove 160 of the outer zone segment 173 is connected in series to the coolant groove channel 166 of the outer zone segment 174 via unplated or conductor-free coolant channel 218 between the RF contacts 216 and 220. The RF terminal contact 220 connects to outer zone plated (or conductor covered) coil segment 174 that takes a broken ring circular path to outer zone RF contact 170.

The inner zone or zone-2 antenna 210 begins at RF contact 222 which connects to inner zone coil segment 186. Coil segment 186 runs in a circular pattern as a broken ring and connects to RF terminal contacts 222 and 224. The coolant groove channel 184 of the inner zone coil segment 186 connects to the inner zone adjacent coil segment coolant groove channel 188 via unplated (conductor free or electrically insulating) coolant channel jumper 226. The inner zone coil segment 190 runs as a broken ring (using plated or inserted conductor) underneath coolant groove channel 188 between RF contacts 227 and 228. The coolant groove channel 188 of the inner zone coil segment 190 connects to the inner zone coolant groove channel 192 of the coil segment 194 via unplated (conductor free or electrically insulating) coolant channel 230. The RF contacts 224 and 227 are externally connected together via an RF capacitor. Similarly, the RF contacts 228 and 232 are linked together via another external RF capacitor. These external capacitor connections (on the atmospheric side of the ICP source) create a 3-turn inner zone coil with two series capacitors for reduced induced voltage. The inner zone RF power supply contacts are the RF contacts 222 and 234. The RF contact 234 connects to coil segment 194 which surrounds optical viewport plug 110 as a broken ring and connects to inner zone RF contact 232. As can be seen in ICP antenna 202, zone-2 antenna portion 208 may operate independently of zone-1 antenna 210 using two separate RF power supplies.

The hermetically-sealed ICP source 100 antenna 202 of FIG. 2, therefore, contains two inductive antenna zones each with three turns. The same design may be arranged with a different external wiring configuration in order to establish, for instance, a three-zone ICP source with two coil turns in each zone. Although a three-zone ICP configuration or another design with more zones is well within the scope of the present invention, the remainder of this description focuses on a two-zone ICP source design configuration. It should be also noted that the design of FIGS. 1 through 4 is electrically configurable externally without any hardware design modifications within the ICP source structure.

As FIG. 2 shows, six pairs of electrical RF contacts are made to the six coil turns using ultrahigh vacuum (UHV) compatible electrical RF feedthroughs in metallic top plate 102 and spring-loaded (or soldered) electrical wires attached to the coil segments. These 12 electrical contacts connect to the multi-zone segment terminals 211 ($Z_{11}$), 212 ($Z_{12}$), 150 ($Z_{13}$), 216 ($Z_{14}$), 220 ($Z_{15}$), 170 ($Z_{16}$), 222 ($Z_{21}$), 224 ($Z_{22}$), 227, ($Z_{23}$), 228 ($Z_{24}$) 232 ($Z_{25}$), and 234 ($Z_{26}$). For a two-zone hermetically-sealed ICP source 100 configuration with three coil turns in each zone, the external electrical wiring and capacitor connections is as follows: The electrical RF terminal contacts 211 ($Z_{11}$) and 170 ($Z_{16}$) connect to the first zone RF (e.g., 13.56 MHZ) power supply. External capacitor terminal contacts 212 ($Z_{12}$) and 150 ($Z_{13}$) connect via an external RF capacitor. External capacitor terminal contacts 216 ($Z_{14}$) and 170 ($Z_{15}$) connect via a second RF capacitor. This completes the formation of ICP zone-1 antenna 208 comprising three coil turns and two external capacitors in series. ICP zone-2 antenna 210 is configured by connecting the electrical RF terminal contacts 222 ($Z_{21}$) and 234 ($Z_{26}$) to the second RF power supply. One external RF capacitor is used to connect RF terminal contacts 224 ($Z_{22}$) and 227 ($Z_{23}$) while another RF capacitor links RF terminal contacts 228 ($Z_{24}$) and 232 ($Z_{25}$) together. A phase shifter/controller may be used between the two ICP RF power supplies in order to control the phase angle between the two power sources. Moreover, another phase shifter may be used to control the phase angle between any of the ICP RF sources and the substrate bias RF power supply. If desired, the ICP source 100 design of FIGS. 1 through 4 may be externally configured for operation as an n-zone ICP source with n=1, 2, 3, 4, or even larger. The number of coil turns in each zone can also be selected by the design of the external wiring and series RF capacitor arrangement.

Figure 3:
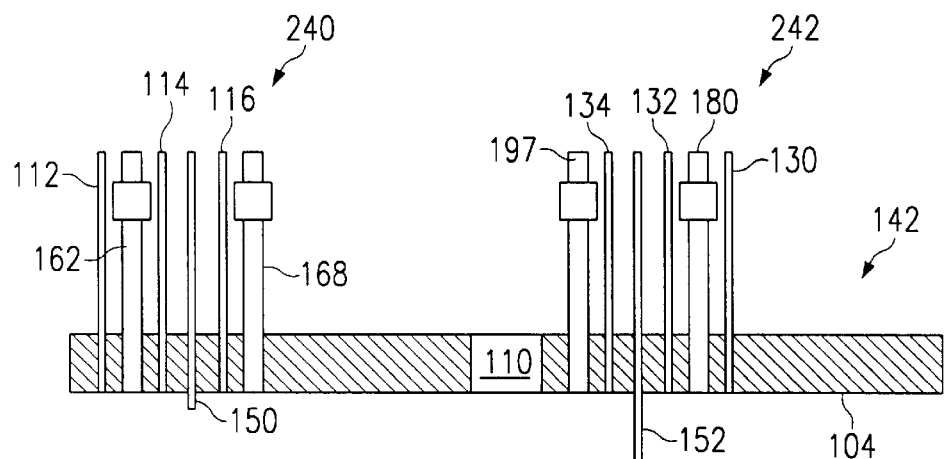
FIG. 3 shows a cross-sectional view of the top ceramic or dielectric plate of the FIG. 1 embodiment (first embodiment)

FIG. 3 describes in more detail the construction of top dielectric plate 104 including the bonded ICP feedthroughs. Top dielectric plate 104 may be formed of a thermally conductive and electrically insulating ceramic material such as aluminum nitride (AlN), boron nitride, or even aluminum oxide. Top dielectric plate 104 has, in the present embodiment, several bonded feedthroughs for two antenna zones and six showerhead zones. In the left-hand side feedthrough section 240, ICP antenna zone-1 electrical feedthrough 150 connects to one of the RF contacts in zone-1 RF antenna 208 of FIG. 2. There are six electrical RF feedthroughs for the ICP zone-1 segments and another six electrical RF feedthroughs for the ICP zone-2 segments. In the right-hand side feedthrough section 242, ICP antenna zone-2 electrical feedthrough 152 connects to one of the RF contacts in zone-2 RF antenna 210 of FIG. 2. Top dielectric plate 104 also includes the necessary feedthrough inlets 112, 114, 116, 130, 132, and 134 for gas flow connections to the showerhead injector dispersion cavities (six showerhead zones are shown). Similarly, top dielectric plate 104 permits flow of cooling water through bonded tubes for zone-1 coolant inlet 162 and zone-1 coolant outlet 168. Top dielectric plate 104 also includes two bonded tubes for zone-2 coolant inlet 180 and zone-2 coolant outlet 197. Except for the RF feedthroughs, all the bonded feedthroughs (gas injection inlets and coolant inlet/outlet tubes) are flushed against the bottom surface of the top dielectric plate 104 (or they can be bonded to the dielectric holes by partial feeding the tubes into a fraction of the dielectric plate thickness).

FIG. 3, therefore, illustrates top dielectric plate 104 with all the bonded tubings (for gas injection and water cooling) and electrical RF connectors. For an ICP source with a multi-zone injector, multiple gas injection tubes are used whereas for an ICP source with a single-zone showerhead, a single gas injection tube can be used. The FIG. 3 design also shows four water cooling tubes 162, 168, 180, and 197. If desired, the number of water cooling feedthrough tubes can be reduced to two by interconnecting the ICP antenna cooling channels in series internally by added coolant groove segments (w/o metallization or conductor jumpers/links) between the broken rings in the middle dielectric plate containing the ICP antenna grooves containing the conductor grooves.

Figure 4:
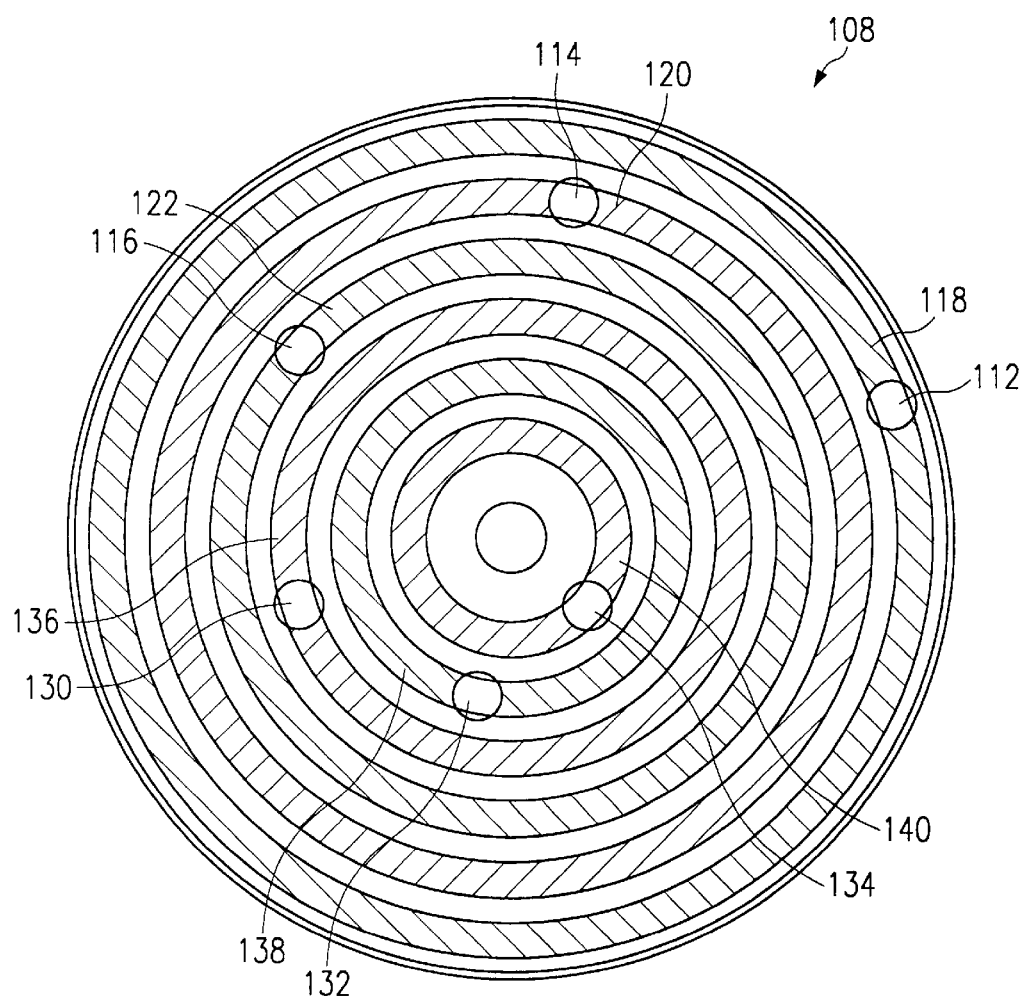
FIG. 4 illustrates the bottom view of the middle dielectric plate indicating the gas dispersion cavities and their associated gas injection inlets for the multi-zone ICP embodiment of FIG. 1 (the first embodiment)

FIG. 4 illustrates a facial bottom surface view of the middle dielectric plate 106 of the present embodiment. This dielectric plate surrounds optical plug 110 and may be formed of a thermally conductive and electrically insulating ceramic material such as aluminum nitride (AlN), boron nitride (BN), or even aluminum oxide ($Al_2O_3$). In the present embodiment, ceramic showerhead 108 includes six gas injection zones, each corresponding to one of the gas dispersion cavities embedded in the middle dielectric plate 108 and shown in FIG. 4. These gas dispersion cavities are shallow circular grooves formed in the middle dielectric plate 106 and connected to the gas injection inlets. In particular, inner gas dispersion cavity ring 140 receives process gas via gas injection inlet 134 and uniformly directs the process gas to the inner zone of showerhead 108 injection holes 146. Second gas dispersion cavity 138 receives process gas via gas injection inlet 132 and uniformly distributes the process gas to the second zone of showerhead injection holes 144. Third gas dispersion cavity 136 receives process gas from gas injection inlet 130 and distributes the process gas to the third zone of showerhead injection holes 142. Fourth gas dispersion cavity 122 receives process gas through inlet 116 and guides the process gas to the fourth zone of showerhead injection holes 128. Fifth gas dispersion groove 120 receives process gas from inlet 114 and distributes the process gas to the fifth zone of showerhead injection holes 126. Sixth gas dispersion cavity 118 receives process gas from inlet 112 and directs the process gas to the outer zone of showerhead injection holes 124.

The vacuum, water, and process gas seals for hermetically-sealed ICP source 100 may be established either using bonded junctions that are formed using a thermal bonding process or, alternatively, elastomer O-ring seals. Thermal bonding using a suitable low melting point metal or metal alloy is a preferred method for establishing hermetic seals in ICP source 100 since a bonded structure eliminates the possibilities of process contamination, base pressure degradation, and outgassing problems associated with elastomer O-ring seals. Indium, indium alloys, or other suitable bonding materials may be used for formation of the bonded ICP structure. An alternative to metal-based thermal bonding is hermetic bonding using a thermally cured epoxy material.

As shown in FIG. 1, besides the metallic top plate 102, ICP source 100 housing comprises a stack of three electrically insulating disks. As described earlier, these disks may be made of a ceramic material, preferably a thermally conductive ceramic material such as aluminum nitride (AlN), boron nitride (BN), alumina ($Al_2O_3$), or even a plasma-resistant polymer based material, such as Vespel. Due to their high-temperature stability, ceramic materials work well for the ICP source 100 structure when assembled using a thermal bonding process. This is due to the fact that the thermal bonding processes using various bonding materials may require bonding temperatures in the range of 200° C. to 600° C. A bonding temperature of <300° C. can be used using tin (Sn) or indium (In) or their alloys as the metallic bonding material. Moreover, the epoxy bonding processes usually employ thermal cure temperatures <300° C.

The use of optical viewport 198 of ICP source 100 is optional and this viewpoint may be positioned at the center of hermetically-sealed ICP source 100. Optical plug or light pipe 110 may be made of a suitable optically transmissive light pipe material such as quartz or sapphire for implementation of a real-time in situ sensor. Viewport 198 provides a suitable wafer view for integration of a full-wafer interferometry sensor for real-time rate and process uniformity control. This viewport can also be used for integration of other types of plasma sensors such as a single-wavelength or spectral plasma emission sensor. The ICP source design concepts of this invention are applicable to both planar and contoured ICP coil designs. For 8" wafer processing, metallic top plate 102 may have a diameter of 14" to 20°. The vacuum plate diameter could be as much as 20" as is the case of the Universal Plasma Module (UPM) manufactured by CVC Products of Rochester, N.Y., which has an internal chamber diameter of 18". Metallic top plate 102 may have thickness in the range of ¼" to 1" to provide sufficient mechanical strength for use on a vacuum process chamber.

Top dielectric plate 104, middle dielectric plate 106, and showerhead 108 form a stack of three bonded ceramic (AlN, $Al_2O_3$ or BN) or polymer-based (e.g., Vespel) disks as the main ICP antenna housing of the ICP source 100. The showerhead plate 108 is a relatively thin plate (e.g., a thickness of ⅛", to ¼") with an array of rings of circular holes (0.5 mm to 1 mm diameter holes) forming a six-zone showerhead configuration. The central opening 109 of showerhead 108 preferably has a diameter in the range of 0.50" to 1.51" to receive viewport optical plug 110. Showerhead 108 is thermally bonded (or connected using an elastomer O-ring seal) to the middle dielectric plate 106 which contains the ICP RF antenna coil segments and cooling water channels.

The ICP source embodiment depicted in FIGS. 1 through 4 shows that only the bottom surface of the ICP antenna grooves or the coolant channels contain conductor channels to form the ICP coil segments. If desired, a metallization process (e.g., electrochemical plating or a combination of sputtering and electroplating depositions) may be used to form the conductor channels by coating not only the cooling channel bottom surfaces, but also the groove sidewalls for reduced RF resistance. For 8" wafer processing, the optimum ICP source ceramic housing diameter is 10" to 14" and preferably 12". If desired, the ICP antenna conductor segments may be prefabricated from a suitable material such as aluminum or copper and subsequently inserted in the designated antenna channels.

Figure 5:
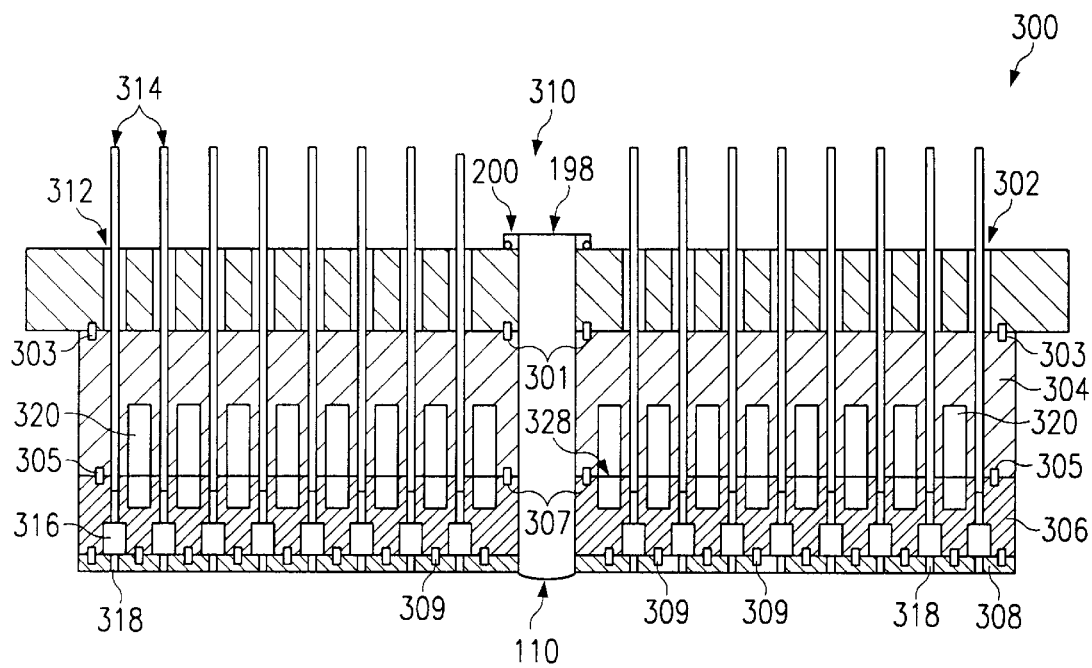
FIG. 5 depicts a first cross-sectional view of an alternative or second embodiment of multi-zone ICP structure of the present invention.

FIG. 5 shows a first cross-sectioned view of an alternative or second embodiment of the present invention as ICP source 300. This alternative embodiment demonstrated in FIGS. 5 through 9 shows a planar hermetically-sealed multi-zone (HMZ) ICP source design without any contouring of the ICP antenna or the dielectric housing. HMZ ICP source 300 includes metallic (e.g., stainless steel) vacuum plate 302 that attaches to top dielectric plate 304 and provides vacuum seal to plasma process chamber (not shown). Top dielectric plate 304 contacts vacuum plate 302 either using hermetic bonded junctions or elastomer O-ring seals (301 and 303). Top dielectric plate 304 attaches to middle dielectric plate 306 via junctions 305 and 307 which are formed either using hermetic bonding or O-ring seals. Moreover, middle dielectric plate 304 is sealed against showerhead plate 308 using bonded junctions 309 or a single outer O-ring seal. Optical viewport 310 includes optical plug 110 or optical window 198 which is hermetically sealed to flange 200 which is secured to vacuum plate 302 using a metal or wire seal. In addition, vacuum plate 302 includes numerous embedded coolant channels to prevent heating of the plate 302 by the ICP RF antenna. Multi-zone process gas injection inlets 314 pass through feedthrough holes 312 in vacuum plate 302, pass through top dielectric plate 304, and continue to middle dielectric plate 306 to provide process gas to showerhead zone dispersion cavities 316. Showerhead zone dispersion cavities 316 receive process gases from the showerhead inlets 314 and provide uniform gas distribution to showerhead injection hole, 318.

Besides the gas dispersion cavities 316 and bonded gas injection inlets 314, the lower dielectric plate 306 also includes the ICP source antenna segments 328 (eight separate segments shown). The ICP source antenna segments 328 are formed by filling the grooves formed on the top surface of the middle dielectric plate using a plating, evaporation, sputtering, or a casting/molding process. An alternative method is to prefabricate the ICP source antenna segments from a suitable material such as aluminum or copper and subsequently insert them in the middle plate antenna cavities. The ICP antenna segments 328 may also be made of other metallic materials such as refractory metals. The top dielectric plate 304 contains coolant grooves 320 formed over the ICP antenna coil segments. These coolant channels connect to external coolant inlet/outlet channels and prevent heating of the ICP source housing during its operation. The ICP structure of FIG. 5 consists of a stack of four plates (one metal and three dielectric plates) which are connected together either using an O-ring-free hermetic bonding process (using indium or another material as a bonding agent or using thermal epoxy bonding) or using elastomer O-ring seals. The dielectric plates may be made of a suitable ceramic (AlN, BN, or $Al_2O_3$) or polymer (e.g., Vespel) material. The gas injection inlets 314 (made of stainless steel tubes) are externally connected to one or more gas manifolds for single-zone or multi-zone showerhead operation.

Figure 6:
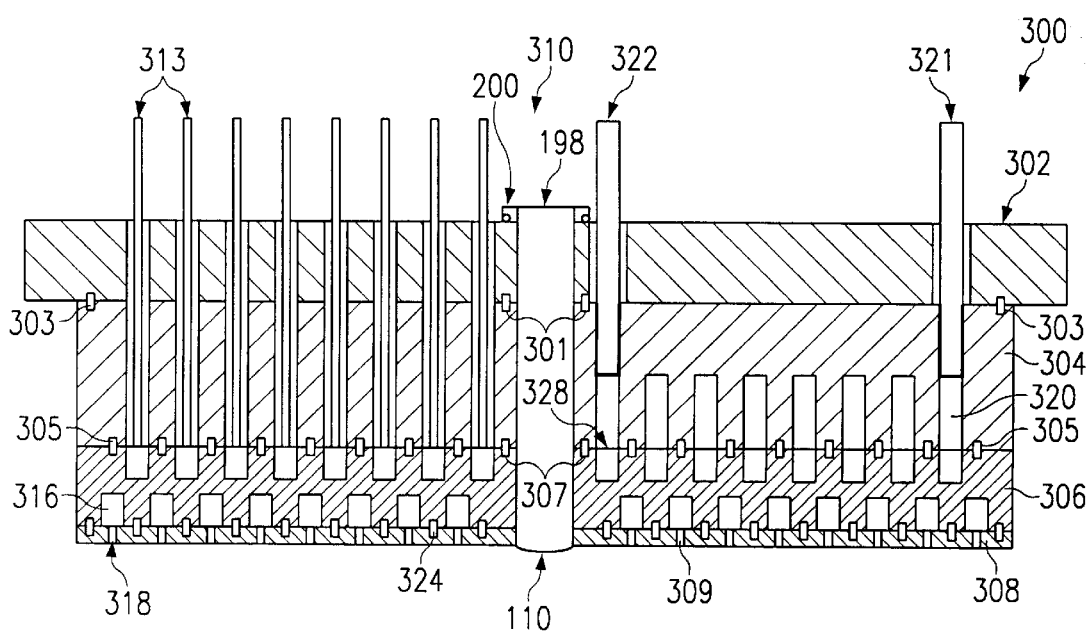
FIG. 6 shows a second cross-sectional view of the FIG. 5 embodiment (second embodiment) of the invention.

FIG. 6 shows a different cross-sectional view of multi-zone ICP source 300 of FIG. 5 along a cross-sectional plane which is perpendicular to that of FIG. 5. Components previously described in connection with FIG. 5 are identical to those appearing in FIG. 6. FIG. 6 shows additionally, however, cooling water (or any coolant) inlet 321 for directing cooling water to the cooling water channels 320 which are connected in series by coolant jumpers within top dielectric plate 304 to cooling water outlet 322. To connect various components of multi-zone ICP source 300, the present embodiment uses several bonded junctions 324 using indium or another suitable bonding material. FIG. 6 also shows spring-loaded or soldered electrical feedthrough connectors 313 for various ICP antenna coil segments. For instance, sixteen electrical connectors are used for the ICP source structure with eight (antenna) coil segments.

Figure 7:
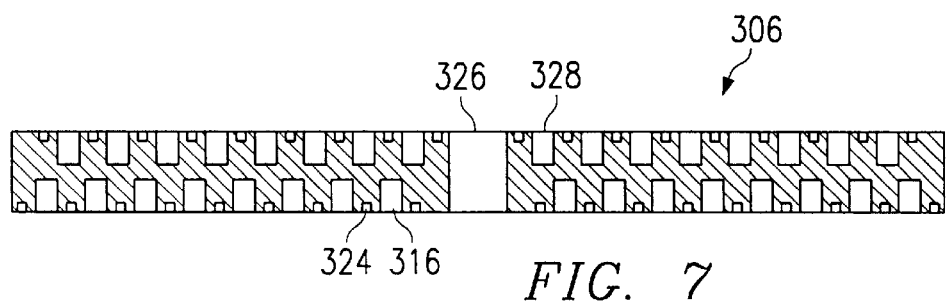
FIG. 7 provides a cross-sectional view of the middle dielectric plate of the FIG. 5 embodiment (second embodiment)

FIG. 7 shows one embodiment of middle dielectric plate 306 that appears in the FIG. 5 embodiment. As previously mentioned, middle dielectric plate 306 is made of a suitable thermally conductive and electrically insulating substrate material which includes passageway 326 for receiving optical plug 110 of optical viewport 198 (or for providing an optical view of the plasma chamber and/or wafer surface) for sensor-based process monitoring and control applications. In a circular broken-ring configuration, numerous aluminum-filled or copper-filled (or in general electrical conductor filled) grooves or trenches appear for receiving radio frequency electrical power and serving as multi-zone ICP antenna portions 328. Also within middle dielectric plate 306 are multiple showerhead zone dispersion cavities 316. Plate bonding junctions 324 are formed on the top and bottom surfaces of middle dielectric plate 306 in order to establish hermetic seals for the multi-zone ICP structure. Middle dielectric plate 306 may be made of a thermally-conducting, electrically-insulating ceramic disk such as a 12" diameter disk of aluminum nitride, aluminum oxide, or boron nitride. In the embodiment of FIG. 7, conductor-filled (such as aluminum-filled or copper-filled) trenches 328 take the form of eight planarized coil turns in the shape of broken rings. The hermetically-sealed multi-zone ICP antenna segments become an integral part of the middle dielectric plate 306. These antenna segments may be separately fabricated and subsequently inserted in the middle dielectric plate trenches 328 prior to hermetic sealing or bonding of the multi-zone ICP structure. The showerhead zone dispersion cavities 316 form continuous concentric rings around optical plug hole 326 on the bottom surface of the middle dielectric plate 306. Plate bonding junctions 324 can be formed within hermetic sealing trenches and form continuous concentric rings between the adjacent gas dispersion cavities on the bottom surface and multi-zone ICP antenna segments on the top surface. The bonding material may be, for example, aluminum, tin, aluminum silicon, indium, or other compatible materials such as brazing materials or thermally conductive epoxy materials.

Figure 8:
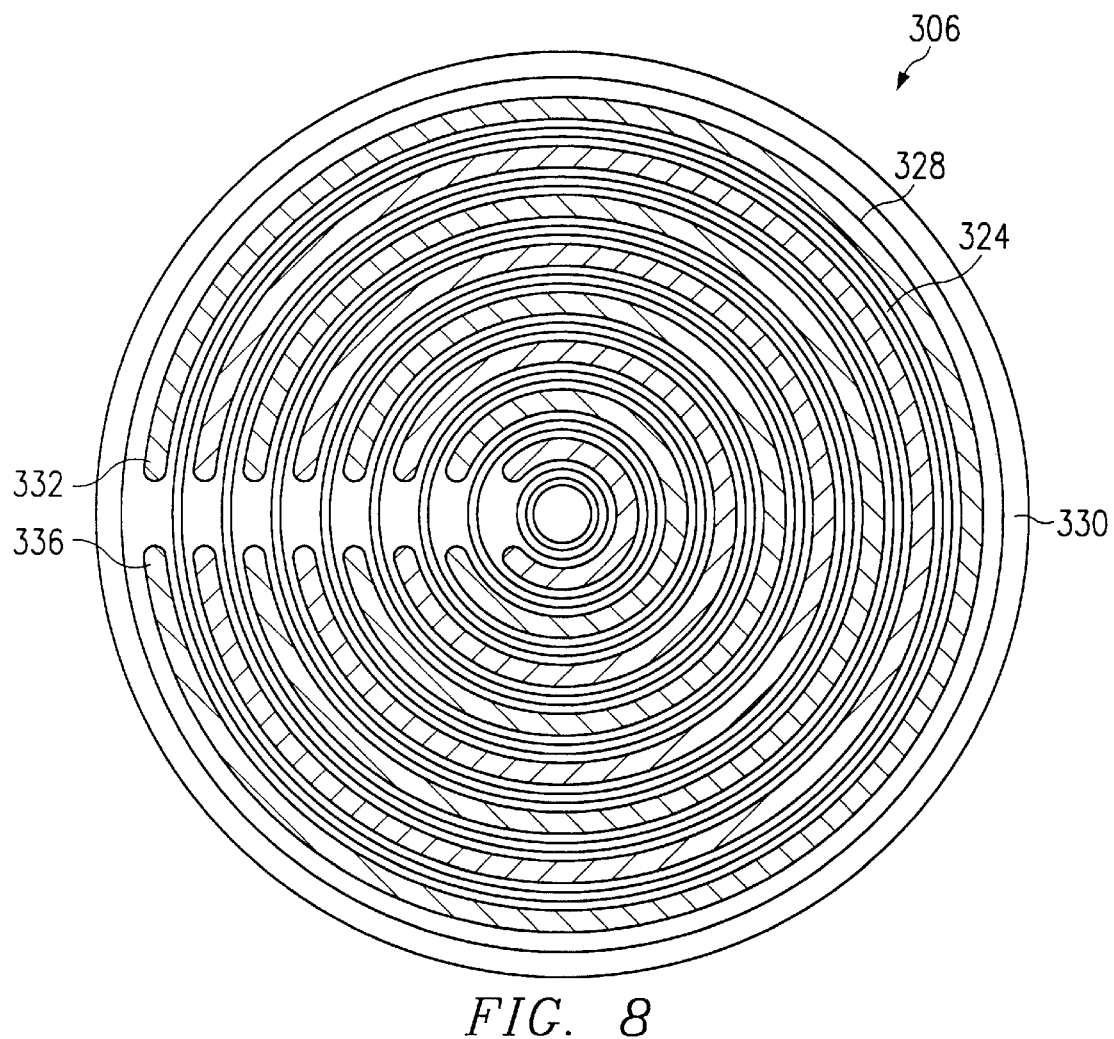
FIG. 8 illustrates the hermetically-sealed coil structure of the FIG. 5 embodiment of the invention or the top view of the middle dielectric plate of the second embodiment.

FIG. 8 shows a facial top surface view of middle ceramic plate 306 to illustrate the hermetically sealed antenna structure of the embodiment of FIG. 5. In particular, top planarized surface 330 includes, in the FIG. 8 embodiment, nine concentric and continuous rings of hermetic bonding joints 324 for forming a hermetic bond between middle dielectric plate 306 and top dielectric plate 304. Each hermetic bonding joint 324 preferably includes a circular shallow groove or trench filled with a suitable bonding material such as indium. To form the multi-zone coil configuration of FIG. 8, eight (or any other desired number of) inductive coil segments 328 are employed which are in the form of concentric broken rings separated from one another by hermetic sealing trenches 324. Multi-zone coil segments 328 fill the designated substrate grooves and may be formed of aluminum or another electrically conductive material such as copper.

Although eight coil segments are shown in FIG. 8, fewer or more number of inductive segments may also be used for a specific application, depending on the multi-zone ICP uniformity control requirements and substrate size to be processed. Each segment cross sectional area may be approximately 0.25 inches to 0.5 inches wide with a thickness of 0.001 inches to 0.120 inches. Each concentric broken ring 328 includes two electrical contact terminals 332 and 336 for connecting to an external radio frequency power source or for external interconnection of the antenna coil segments to each other via RF capacitors. In one example of the FIG. 8 embodiment, middle ceramic plate 306 has a 12-inch diameter with a 0.25 inch thickness for eight-inch wafer processing. The plate may be made of aluminum nitride (AlN), boron nitride (BN), aluminum oxide ($Al_2O_3$), or another suitable material.

Figure 9:
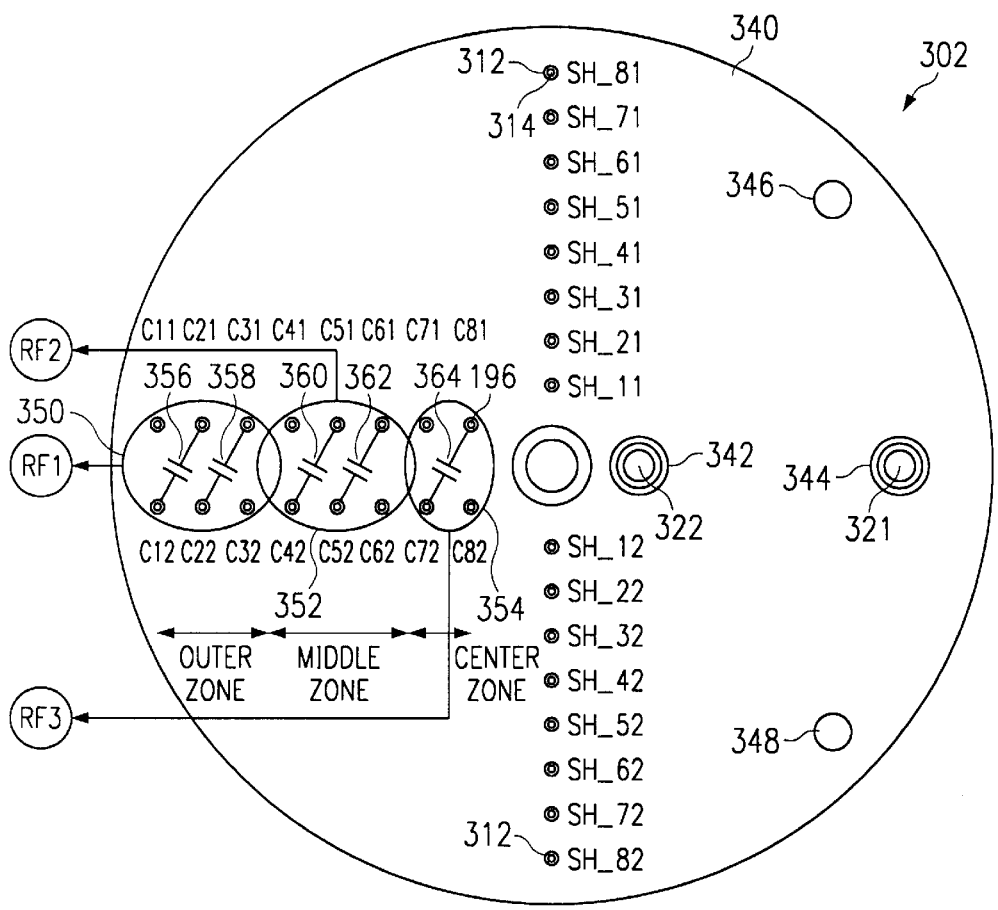
FIG. 9 depicts a top facial view of the top vacuum plate of the FIG. 5 embodiment, indicating the feedthroughs for electrical RF, gas injection, and cooling water.

FIG. 9 illustrates a top facial view of metallic vacuum plate 302 for the FIG. 5 embodiment. Top surface 340 of metallic top plate 302 shows feedthrough channels 312 that permit passage of multi-zone showerhead process gas inlets 314. The designations of showerhead inlets appearing in FIG. 9 are as follows. SH-81 and SH-82 are two half-zone showerhead gas inlets for the outermost injection zone holes 318 for showerhead injector plate 308 of FIG. 5. Each successive designation SH-71 and SH-72, SH-61 and SH-62, SH-51 and SH-52, etc., down to SH-11 and SH-12, indicate half-zone pairs of showerhead inlets for the associated showerhead injection zone grooves 318 down to the innermost showerhead injection zone holes 318 closest to the opening for optical plug 110. For the particular configuration shown in FIG. 5, the gas injection inlets (SH-11/SH-12 to SH-81/SH-82) can be externally configured using gas manifolds such that the multi-zone ICP source showerhead may operate as an n-zone showerhead with "n" selectable between 1 and 8. In addition to showerhead inlets appearing on top surface 340 there also appears ICP source coolant inlet 322 and ICP source coolant outlet 321. ICP source coolant inlet 322 provides coolant (e.g., cooling water) flow to coolant channels 320 of top dielectric plate 304. Coolant inlet 346 and coolant outlet 348 provide a coolant flow for cooling channels embedded within metallic vacuum plate 302.

In FIG. 9, metallic top plate 302 also includes on top surface 340 external RF capacitor components associated with partitioned ICP source zones 350, 352 and 354 (example shown for a three-zone ICP source arrangement). These external RF capacitors include RF capacitors 356 through 364. In the embodiment of FIG. 9, three radio frequency circuits, including RF power supply $RF_1$, RF power supply $RF_2$, and RF power supply $RF_3$ provide RF electrical power signals to the multi-zone ICP source coils via the external capacitor circuitry. In particular, RF power supply $RF_1$ connects to the outer ICP zone via external RF capacitor circuit 350. RF power supply $RF_2$ connects to the middle ICP zone via external power RF capacitor circuit 352. Also, external RF capacitor circuit 354 delivers power from RF power supply RF 3 to the inner ICP zone.

FIGS. 5 through 9, therefore, demonstrate an alternative embodiment for hermetically-sealed multi-zone ICP source 300 that has many features similar to the design described earlier. The alternative design of FIGS. 5 through 9, however, is a completely planar hermetically-sealed multi-zone ICP source without any contouring of the ICP coil segments or the dielectric housing. In this design, middle dielectric plate 306, which may be made of one of several dielectric materials such as alumina or aluminum nitride, contains fully metallized grooves, forming the bonded multi-zone coil structure shown in FIG. 8. The FIG. 8 embodiment shows eight coil segments, although any number of segments (e.g., two to ten) may be used in the design. The middle dielectric plate 306 also includes bottom gas grooves 316 for gas injection. Bottom gas grooves 316 can be formed as continuous rings which connect to the bonded gas injection tubes coming from the metallic top plate 302 feedthroughs.

In this design, hermetically-sealed multi-zone ICP source 300 with its eight coil segments employs an eight-zone showerhead 308 with sixteen gas inlets 314. Each showerhead 308 zone has two gas injection inlets 314 (e.g., SH-11 and SH-12 inlets connected to the showerhead zone 1) for enhanced process uniformity. Each showerhead 308 zone may, however, use only one gas inlet 314 as long as the showerhead 308 gas grooves or gas dispersion cavities 316 provide sufficient gas flow conductance for axisymmetric gas injection through the injector plate holes 318. For a single-zone showerhead (e.g., when ICP is used for low-pressure surface preparation/cleaning applications), only a single gas inlet is required. This can be accomplished by using a gas manifold which connects to all the gas inlets SH-11/SH-12 through SH-81/SH-82. A multi-zone gas inlet configuration, however, provides the flexibility to configure the gas injection as single-zone or multi-zone injection by appropriate external plumbing and gas manifolding.

For the design shown FIGS. 5 through 9, the multi-zone ICP source water cooling channels are included in top dielectric plate 304. Top dielectric plate 304 also contains all the ICP antenna electrical feedthroughs as well as the bonded gas injection inlets and water cooling inlet/outlet tubes. If the entire multi-zone ICP source 300 structure is hermetically bonded to the stainless steel vacuum plate and if the ICP dielectric housing plates (three plates) are made of a relatively high thermal conductivity material such as aluminum nitride (AlN) or boron nitride (BN), the cooling channels and the associated cooling feedthroughs may be eliminated from the top dielectric plate. This is possible because the ICP housing can be effectively cooled using the water-cooled stainless steel vacuum plate. A thermally conductive bonded hermetically sealed junction between the metallic vacuum plate and the top dielectric plate will facilitate heat transfer from the ICP antenna to the water-cooled vacuum plate. As shown in FIG. 9, this multi-zone ICP source can be externally configured as an n-zone source with n=1, 2, 3, 4, or even more (up to 8 for this particular design). The configuration shown in FIG. 9 indicates a three-zone ICP arrangement with three individually controlled RF power supplies.

The external RF capacitors 356 through 364 reduce the induced reactive voltage, resulting in negligible capacitive coupling and sputtering of the chamber and ICP source materials. In the configuration shown in FIG. 9, the eight-segment ICP source has been externally partitioned and configured as a three-zone plasma source. The outer three coil segments in conjunction with two external RF capacitors 356 and 358 form the outer ICP zone 350 (using zone-1 power supply $RF_1$). The middle three coil segments have been grouped together in conjunction with another pair of external RF capacitors 360 and 362 to form the middle or second ICP source zone 352 and are powered by RF power supply $RF_2$. The inner two coil segments are connected in series via external RF capacitor 364 and form the inner or third ICP zone 354. The inner zone is powered by the third RF power supply ($RF_3$). These three RF (e.g., 13.56 MHZ) power supplies may also use phase shifters/controllers for enhanced and repeatable process control. Other external wiring arrangements and multi-zone partitioning(two-zone, four-zone, etc.) are also possible using the same ICP source design.

Figure 10:
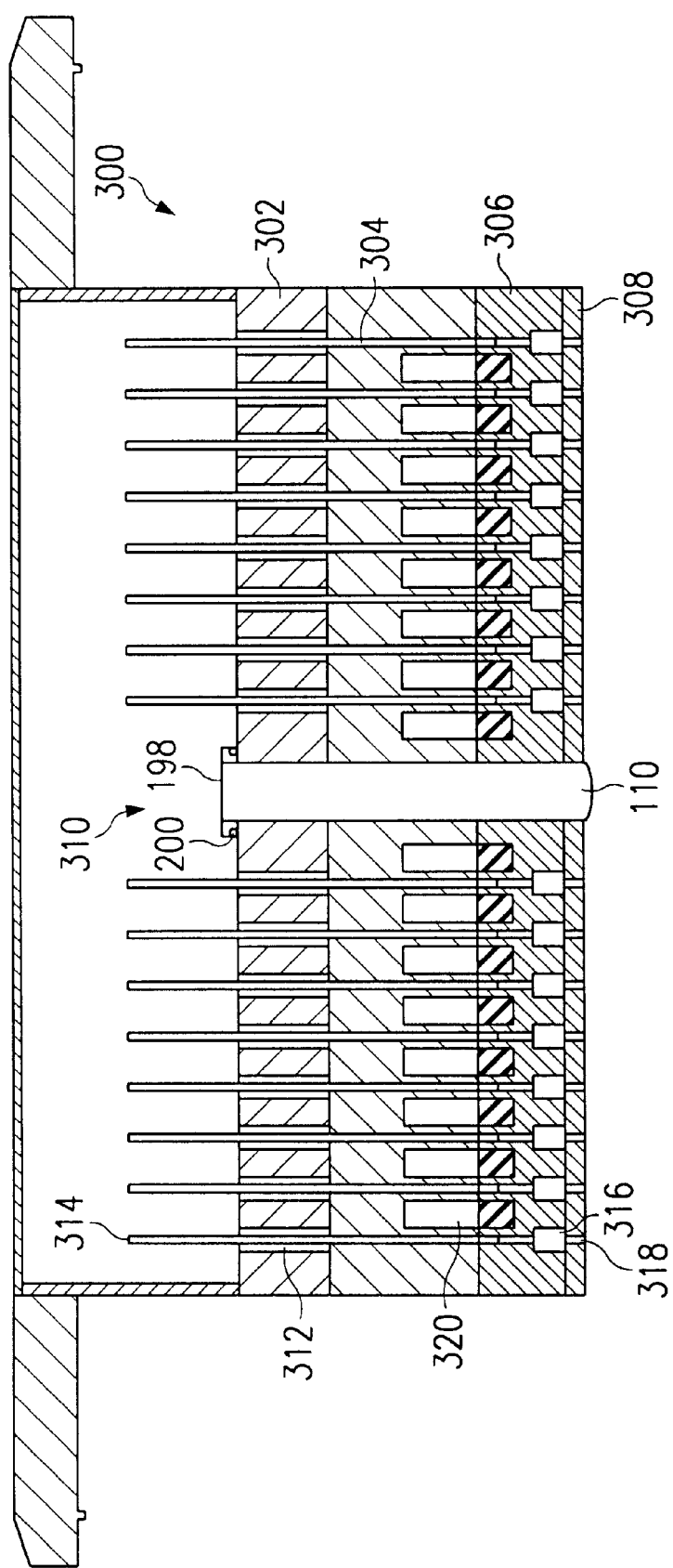
FIG. 10 shows a cross-sectional view of a modified version of the second multi-zone ICP embodiment where the distance between the vacuum plate and the ICP housing has been increased in order to enable smaller minimum ICP source to substrate spacing for enhanced ICP process throughput rate.
Figure 11:
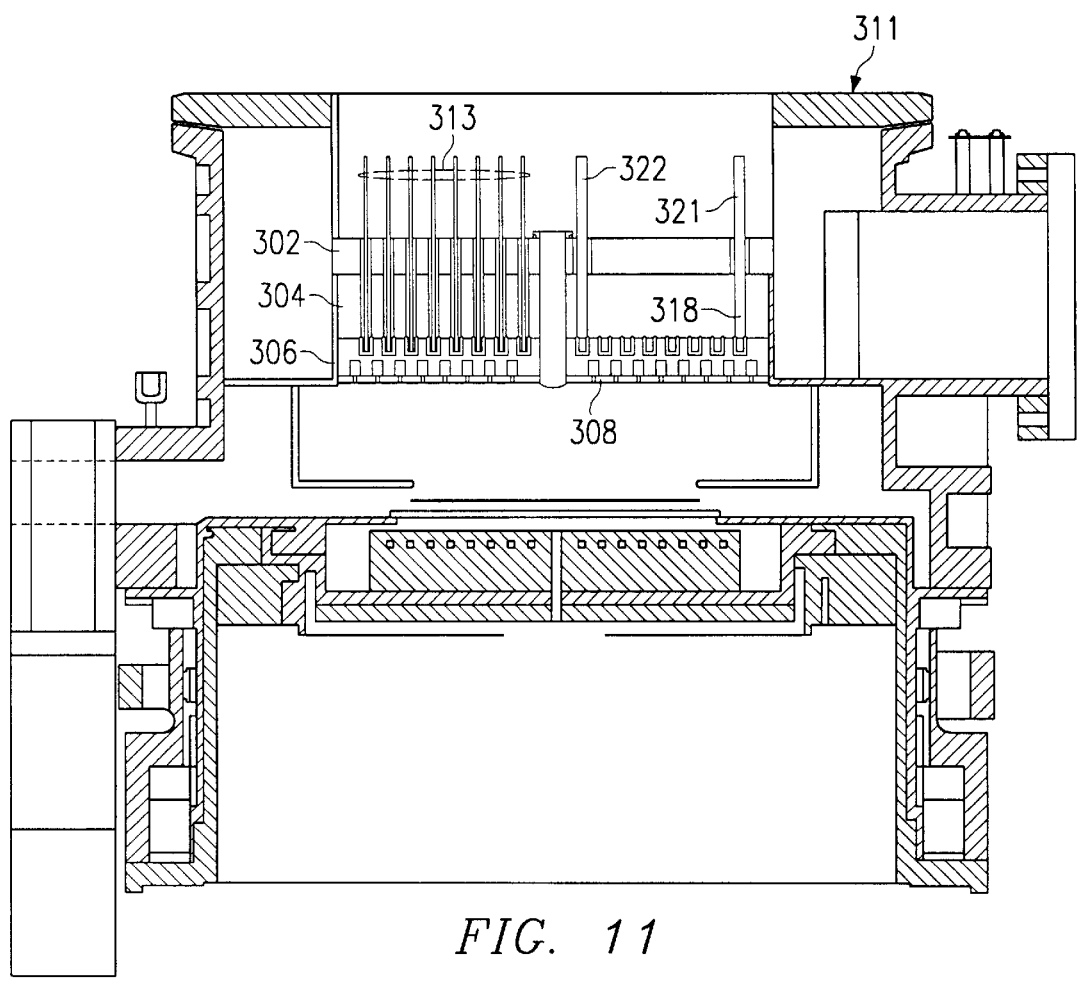
FIG. 11 shows a second cross-sectional view of the modified version of the second ICP embodiment of FIG. mounted on a vacuum process chamber for high-throughput plasma-assisted processing applications.

FIG. 10 shows a cross-sectional view of a modified version of the second multi-zone ICP embodiment (shown in FIGS. 5 through 9) where the multi-zone ICP source housing has been lowered with respect to the process chamber vacuum lid or flange by increasing the spacing between the vacuum plate and the ICP housing (by inserting a welded cylindrical metallic extension part between the ICP housing and the vacuum chamber lid). This modified configuration provides a smaller minimum ICP source to substrate spacing for enhanced ICP process throughput rate, particularly in plasma process camber designs where the up/down travel range for the substrate chuck is restricted. FIG. 11 shows a second cross-sectional view of the modified version of the second multi-zone ICP source embodiment of FIG. 10 mounted on a vacuum process chamber for high-throughput plasma-assisted processing applications. As shown in FIG. 11, the recessed ICP housing allows reduced ICP source to substrate spacing for enhanced process throughput.

Figure 12:
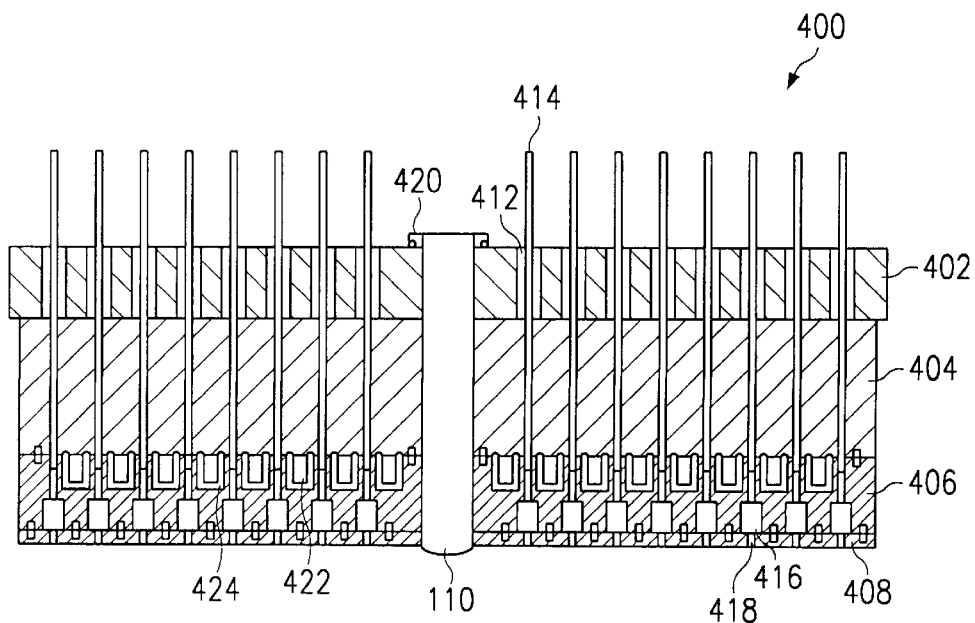
FIG. 12 shows a first cross-sectional view of another (third) embodiment of the invention.
Figure 13:
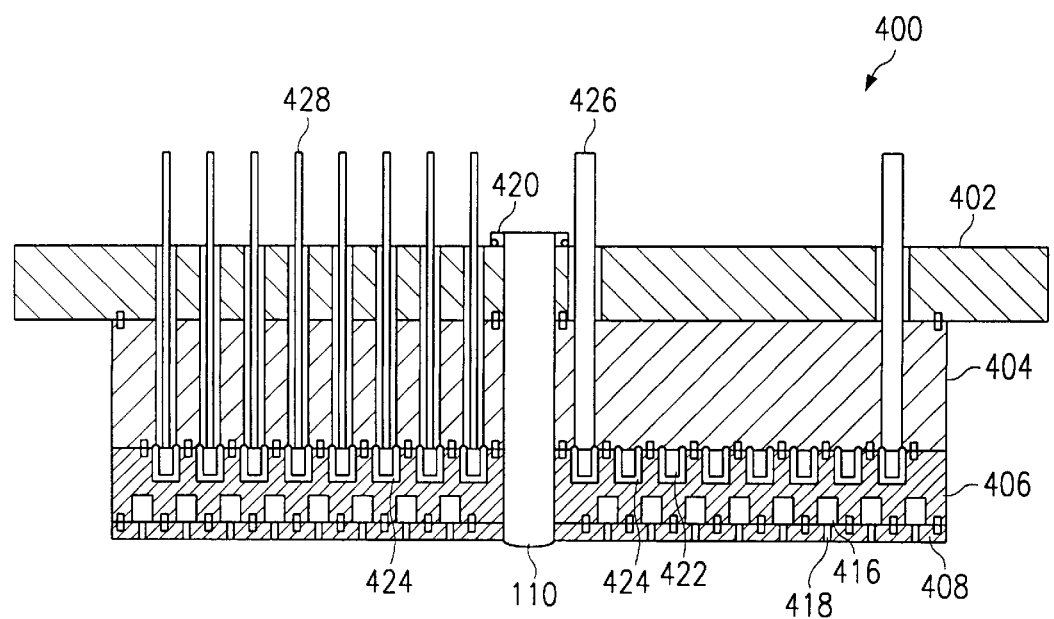
FIG. 13 includes a second cross-sectional view of the FIG. 12 embodiment (third embodiment)
Figure 14:
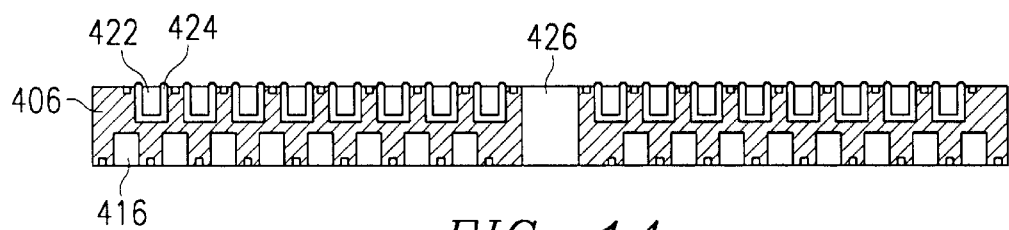
FIG. 14 provides a cross-sectional view of the middle dielectric plate of the FIG. 12 embodiment (third embodiment)

FIGS. 12 through 14 show yet another alternative hermetically sealed multi-zone ICP source 400 embodiment of the present invention. This preferred design is essentially similar to the previous design shown of FIGS. 5 through 9 except for two main differences. FIG. 12 shows alternative hermetically-sealed multi-zone ICP source 400 embodiment in cross sectional view 400 including metallic top plate 402 that attaches to top dielectric plate 404, preferably using a thermal bonding or brazing process. Top dielectric plate 404 attaches to middle dielectric plate 406. Middle dielectric plate 406 bonds to gas injector plate 408. Top vacuum plate 402 includes multiple channels 412 for receiving gas injection inlets 414. Gas injection inlets 414 pass through top dielectric plate 404, are bonded to the top dielectric plate 404, and enter middle dielectric plate 406 where they join showerhead zone cavities 416. Showerhead zone cavities 416 provide process gases to showerhead injection holes 418. Passing through alternative ICP source 400 is optical plug 110 (or an optical viewport) that hermetic metal seal flange 420 connects to top vacuum plate 402. Middle ceramic plate 406 includes distributed cooling water channels 422 that support coil segments 424 on their sidewalls. These coil segments may be formed by plating of the coolant channels.

FIG. 13 shows an alternative cross section of ICP source 400 of FIG. 12. As FIG. 13 indicates, coolant inlet and outlet 426 allow coolant flow through the ICP source housing 400 via the coolant channels 422 formed in the middle dielectric plate 406. Moreover, electrical contact leads 428 allow electrical connections of the multi-zone ICP source cool segments 424 to the external capacitors and RF power supply.

FIG. 14 illustrates in more detail the structure of middle dielectric plate 406 of the present embodiment. As FIG. 14 indicates, RF coil segments 424 line cooling water channels 422. This eliminates the need for formation of deeper coolant channels for cooling RF coil segments. In addition, gas dispersion cavities 416 are formed in the middle dielectric plate 406 for uniform distribution and injection of the process gases via the bottom dielectric plate 408. Opening 426 of middle dielectric plate 406 top surface. An alternative embodiment can form the ICP antenna metallized broken rings on the bottom surface of top dielectric plate 304. The vacuum plate or flange 402 has embedded coolant channels in order to perform additional cooling in the ICP source structure.

With multi-zone ICP source 400, it is also possible to place the ICP coil segments 424 between the showerhead 408 and middle dielectric plate 406 by using metallized shallow grooves either on top surface of showerhead plate 408 or on bottom surface of middle dielectric plate 406. Moreover, by using a hermetic bonding process for the overall assembly of the multi-zone ICP source and by providing embedded cooling channels in the top vacuum plate 402, the ICP source cooling can be performed by the top metallic plate 402 and the dielectric coolant grooves 422 can be eliminated. This eliminates the need for top dielectric plate 404 and reduces the overall ICP housing stack to two dielectric plates plus the metallic vacuum lid 402. In this configuration, ICP coil segments 424 may be placed between the gas dispersion trenches 422 on the gas showerhead plate 408. Moreover, they can be used as part of the bonding structure for hermetic sealing of the showerhead plate 408 to its adjacent dielectric plate 406 which itself is hermetically sealed/bonded to the metallic top plate 402. This simplified multi-zone ICP dielectric plate 406 is of sufficient size to permit passage of optical plug 110 for in-situ plasma process monitoring and control applications.

Consequently, differences between hermetically-sealed multi-zone ICP source 300 of FIGS. 5 through 9 and multi-zone ICP source 400 of FIGS. 12 through 14 include U-shape metallized grooves 422 in the middle dielectric plate, as opposed to the fully filled metallized grooves. As a result of this difference, a second difference is that multi-zone ICP source 400 eliminates the need for fabricating cooling grooves in top dielectric plate 404. This is because the trenches 422 include metallized sidewall and bottom surfaces to form coil segments 424 and can also allow coolant flow for ICP source cooling. This results in a simplified ICP source structure and manufacturing process. As with multi-zone ICP source 300 of FIG. 5, the ICP coil metallization process for multi-zone ICP source 400 may be performed using one or a combination of sputtering and electroplating deposition processes.

Before the ICP source is hermetically bonded to the metallic vacuum plate or chamber vacuum flanges, the ICP coil segments are formed as thin (e.g., 10 $\mu$m to 1000 $\mu$m) layers of metal (Al or Cu) covering the shallow trench 422 sidewalls and bottom surface. These metallized regions are formed in the shape of broken rings in middle structure is the fourth embodiment illustrated in FIGS. 15 through 21.

In order to reduce the eddy current RF losses into the metallic top plate 402 and maximize the RF coupling efficiency to the plasma environment, a series of radial strips of a permeable soft magnetic material or a ferromagnetic material (e.g., nickel, iron, etc.) may be placed between the metallic top plate 402 and the multi-zone ICP source 400 housing prior to structural bonding. This may be done by depositing the high-permeability magnetic material on metallic top plate 402 using electroplating techniques. Alternatively, shallow radial grooves may be formed in the metallic top plate 402 on its vacuum side and thin rods of high-permeability material (iron or nickel or another ferromagnetic material) may be inserted within these grooves prior to the hermetic bonding process to seal the multi-zone ICP source 400 housing to metallic top plate 402. These high-permeability magnetic material segments provide radial paths to close the magnetic field lines over ICP coil segments 424, resulting in improved RF coupling efficiency to the internal plasma environment.

FIGS. 15 through 21, therefore, show a hermetically sealed ICP source 500 with six coil segments and six showerhead injection zones. In general, the design shown here is applicable to any number of coil segments 518 and any number of showerhead injection zones 516. Various designs with equal or different numbers of coil segments and injection zones are possible.

Thus, FIGS. 15 through 21 show yet another alternative embodiment of the present invention including vacuum plate 502 that adjoins top dielectric plate 504. Dielectric plate 504 adjoins modified showerhead plate 506. Optical plug or viewport 110 fits within ICP source 500 and is sealed by hermetic metal seals using viewport metallic flange 508. This permits an optical view access through optical plug 110 to the substrate within the plasma process chamber. Vacuum plate or flange 502 includes numerous channels 510 for receiving multi-zone gas inlet tubes 512. Gas inlet tubes 512 go to process gas dispersion channels 514 within top dielectric plate 504. Process gas injection holes 516 connect to process gas dispersion channels 514 for directing process gases through modified showerhead plate 506. In alternative multi-zone ICP source 500, RF coil segments 518 are formed integral to modified showerhead plate or bottom dielectric plate 506. In this configuration, there is no need for additional cooling of RF coil segments 518, since effective cooling of the bonded ICP structure is provided by the embedded coolant channels in the vacuum plate or flange 502.

Figure 15:
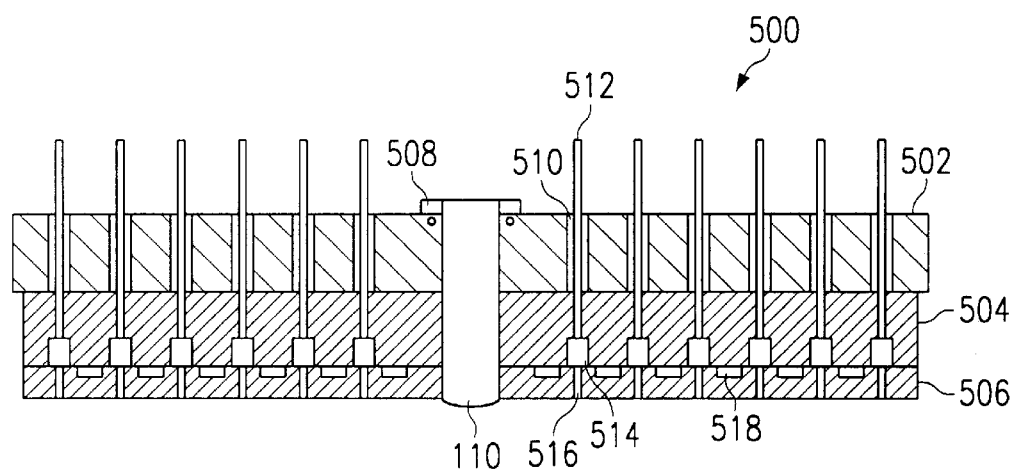
FIG. 15 is a first cross-sectional view of yet another embodiment of the present invention (fourth embodiment)

FIG. 15 shows a stack consisting of three bonded plates. The top plate is a water-cooled stainless steel vacuum plate or flange (typically 14" to 20" in diameter for 200-mm wafer processing (20" diameter for CVC's Universal Plasma Module). Gas inlets 512 in the FIG. 15 embodiment are bonded to the top dielectric plate and flushed/butted against the multi-zone gas dispersion cavities 514. Six cavities 514 are shown along with twelve gas inlet tubes 512.

Figure 16:
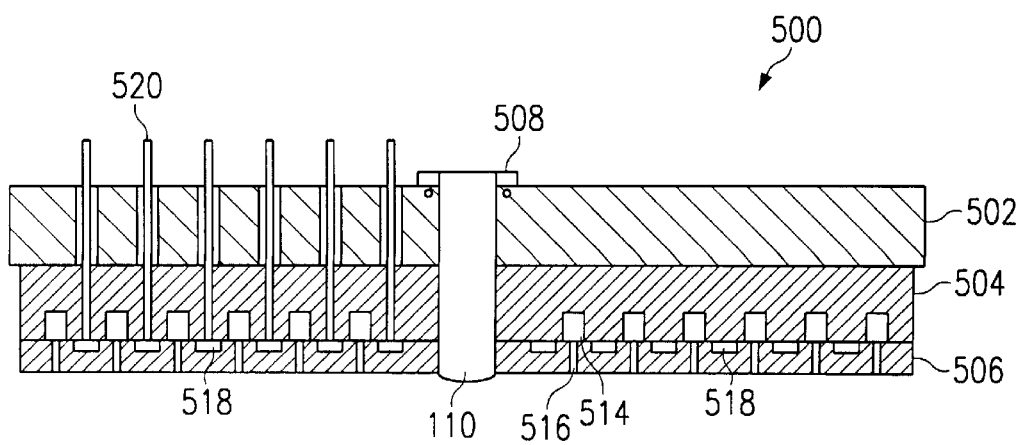
FIG. 16 provides a second cross-sectional view of the FIG. 15 embodiment of the invention (fourth embodiment)

On the other hand, FIG. 16 illustrates six of the twelve electrical RF rods 520 connected to the multi-zone ICP coil segments 518 on the lower dielectric plate or showerhead plate 506. These RF connector rods are thermally bonded, and/or shrink-fit assembled, inside the upper dielectric plate.

Electrical rods 520 are flushed against the bottom surface of the upper dielectric plate 504 and are subsequently fused or bonded to the electrical terminals on the antenna coil segments that appear on FIG. 20. The bottom and top dielectric plates are bonded together on a continuous ring around the edge region as well as on circular bonded junctions (continuous rings) formed between any pair of adjacent coil segments. This will also ensure excellent thermal contact between the top dielectric plate 504 and bottom dielectric plate 506. The coil segments can provide additional bonding surface area for improved thermal contact.

Figure 17:
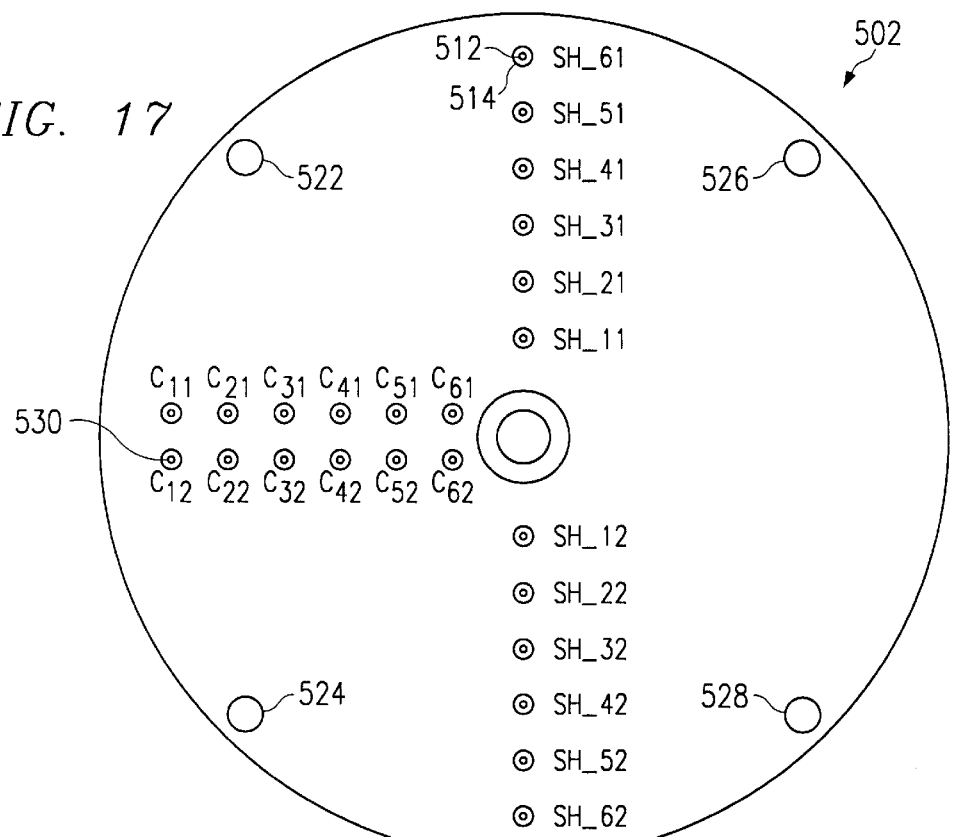
FIG. 17 illustrates a top view of the vacuum plate of the FIG. 15 embodiment (fourth embodiment), indicating various feedthroughs for process gas inlets, coolant flow, and electrical connections.

FIG. 17 shows a top view of vacuum plate 502 of multi-zone ICP source 500. In particular, vacuum plate 502 top view includes vacuum plate coolant inlets 522 and 524 that receive cooling water (or any coolant) for ICP source 500. Cooling water outlets 526 and 528 permit the cooling water to exit multi-zone ICP source 500 for effective heat removal. Gas inlet tubes 512 are shown within channels 514. As is the case with earlier described embodiments, the SH-61 and SH-62 gas inlets correspond to the outermost gas rings of showerhead 506. The decreasing number "SH" associated with the gas inlets 512 correspond to the more inward injection rings of showerhead plate 506. Vacuum plate 502 top surface also includes electrical feedthroughs 530 for connecting to ICP antenna RF coil segments 518 and showerhead plate 506. In the FIG. 17 embodiment, electrical feedthroughs 530 include twelve terminals for six antenna coil segments that connect to the six RF coil segments formed on showerhead plate 506.

For the bonded monolithic structure shown in FIGS. 15 through 21, the water-cooled vacuum plate 502 provides effective cooling of the entire multi-zone ICP source 500 and its associated dielectric housing. This effective cooling is possible since the entire ICP housing bonds together to the metallic vacuum plate. The structural bonding minimizes the thermal resistances between the adjacent dielectric plates 504, 506 as well as between the top dielectric plate 504 and water-cooled vacuum plate 502. Moreover, the multi-zone ICP dielectric housing material can be made of aluminum nitride (AlN) which has a relatively high thermal conductivity on the order of 170 W/m-K. According to FIG. 17, the metallic (stainless steel) vacuum plate or flange provides a number of through holes for various multi-zone ICP source feedthroughs.

Figure 18:
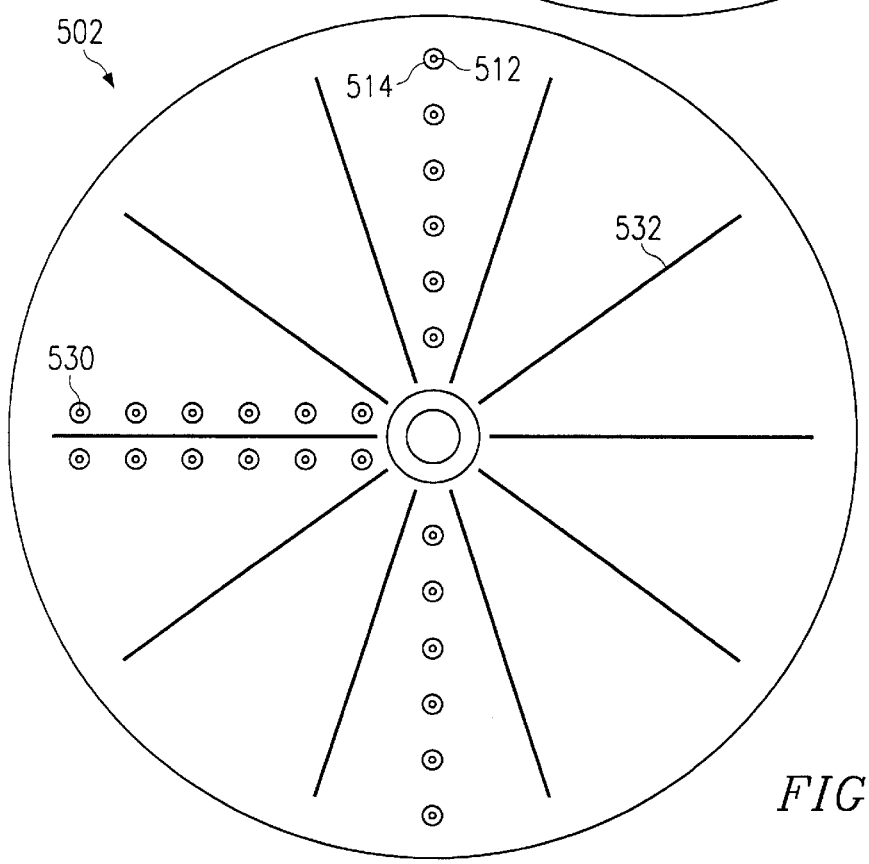
FIG. 18 shows a bottom view of the vacuum plate appearing in FIG. 17, indicating the radial low-reluctance magnetic rod positions.

FIG. 18 shows a bottom view of vacuum plate 502 of the FIG. 13 embodiment. In particular, the bottom view of vacuum plate 502 shows gas inlets 512 emanating from through channels 514 as well as electrical feedthroughs 530 that pass through vacuum plate 502. In addition, the bottom view of vacuum plate 502 shows embedded radial ferromagnetic rods 532 that are made of a high permeability magnetic material. For example, in one embodiment embedded radial rods 532 may be 8" long by 0.5" wide by 0.25" thick rods of iron or nickel or a more suitable ferromagnetic material with low eddy-current losses that are inserted into same size grooves at the bottom surface of vacuum plate 502. In FIG. 18, there are ten radial rods 532 in vacuum plate 502.

Radial rods 532 that FIG. 18 shows are embedded within grooves in vacuum plate 502 and may be made of a magnetic material such as high permeability iron or nickel and provide radial paths to close the magnetic field lines below the vacuum plate. This will result in a reduction of eddy current losses into the metallic vacuum plate and improves the overall multi-zone ICP source 500 RF power coupling efficiency into the plasma environment. If necessary, radial rods 532 may be replaced with a blanket plated layer of iron or nickel on vacuum plate 502 (in this case the rods and grooves will not be needed).

For the specific design presented here, the vacuum plate has 12 holes for showerhead gas inlet tubes (SH-11, SH-12, SH-21, SH-22, SH-31, SH-32, . . . ), and another set of 12 holes for multi-zone ICP electrical connections. Moreover, there is a center hole (0.5" to 1.5" in diameter) which is used for insertion of the optical viewpoint. The metallic vacuum plate (14" to 20" in diameter) has a thickness of 0.25" to 0.50" for providing vacuum mechanical strength.

Figure 19:
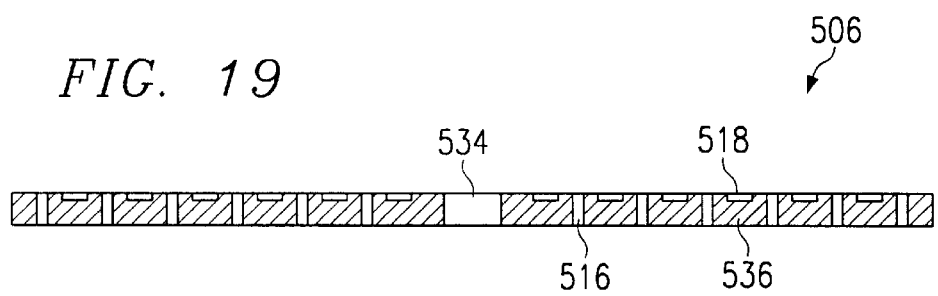
FIG. 19 depicts a cross-sectional view of the bottom dielectric plate for the FIG. 15 embodiment of the invention (fourth embodiment)

FIG. 19 shows modified showerhead plate 506 of the FIG. 15 embodiment. Modified showerhead assembly 506 is formed of a dielectric material such as aluminum nitride, aluminum oxide, boron nitrides or another suitable material and includes injector holes 516 and ICP coil segments 518. ICP coil segments 518 are bonded to the top portion of ICP showerhead plate 506 as six monolithic coil segments. Showerhead injector holes 516 include six rings of holes, each hole with a diameter in the range of 0.02 inches to 0.06 inches, with a total number of holes for each injector zone 1 through 6 ranging from 50 to 500 (outer rings to have more holes). Center hole 534 has a diameter of between 0.25 inches and 1.0 inches for passage of optical plug 110. ICP coil segments 518 fit within grooves 536 of modified showerhead 506 which have a depth of 0.001 to 0.1 inches and a width of 0.25 to 0.5 inches.

Figure 20:
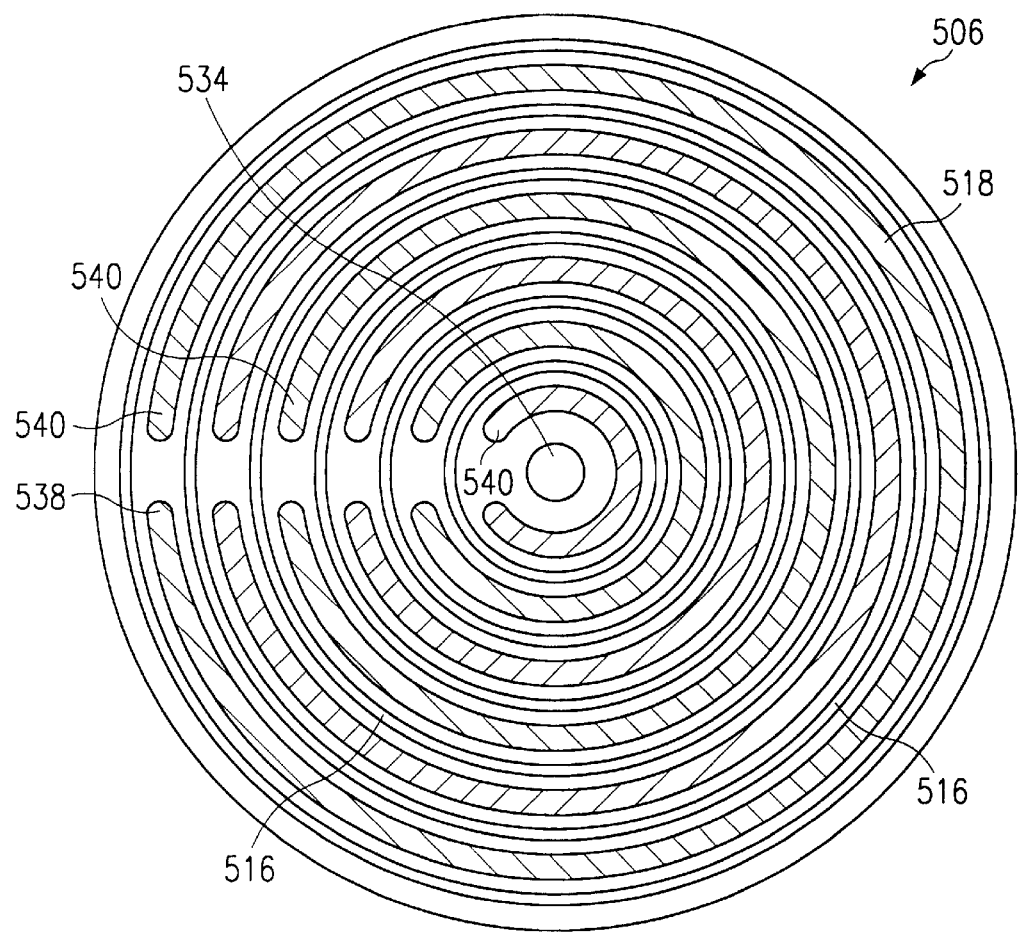
FIG. 20 is a top view of the bottom dielectric plate of FIG. 19.

FIG. 20 shows the top surface view of modified showerhead plate 506. Modified showerhead 506 includes, in the FIG. 20 embodiment, six monolithic coil segments 518 that fill substrate grooves 536 (see FIG. 19) and include terminals 538 and 540 for external RF connections to external RF capacitor circuits. The showerhead 506 embodiment that FIG. 20 shows includes injector holes 516 for injecting processed gas into the process chamber for plasma processing of various substrates.

Bottom dielectric plate 506 serves two purposes. One is to provide multi-zone process gas injection, the other is to house coil segments 518 (formed by preformed metal segments to be sandwiched between the two dielectric plates or formed by sputtering and/or plating on dielectric plate 506) which are made of a suitable material such as aluminum or copper. Coil segments 518 fill shallow grooves (0.001" to 0.100") shaped as broken rings. The surface of dielectric plate 506 may be planarized using a mechanical polishing process, for example after filling the shallow trenches with metal.

Figure 21:
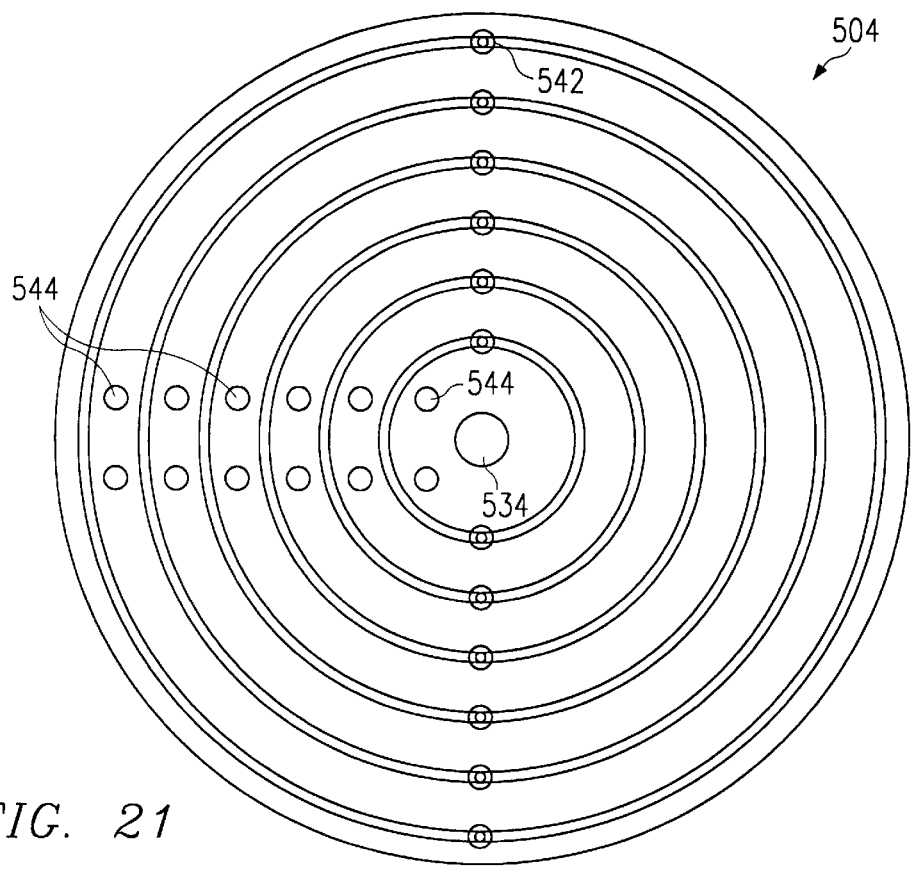
FIG. 21 provides a bottom facial view of the top dielectric plate of the FIG. 15 embodiment of the present invention (fourth embodiment)

FIG. 21 shows a bottom surface view of top dielectric plate 504 of the FIG. 15 embodiment. Attaching to top dielectric plate 504 are stainless steel tubes 512 for providing plasma process gas to gas dispersion cavities 514. Stainless steel tubes 512 are bonded stainless steel tubes for multi-zone gas injection through gas dispersion cavities 516, with two tubes positioned 180° apart for each gas dispersion cavity ring. Bonded aluminum rods 520 form six pairs for electrically connecting coil segments 518 to external RF capacitors and RF power supplies. FIG. 21 also shows opening 534 for passage of optical plug 110. Compared to the previous multi-zone ICP source embodiments of this invention, this last design offers some advantages due to its simplified structure and reduced fabrication cost.

Gas dispersion cavities 514 are formed as ring-shaped cavities (0.25"–0.50" wide by 0.25" to 0.50" deep). These cavities will overlay the multi-zone injector holes 516 in the bottom dielectric plate. Also shown in FIG. 21 are the gas inlet tube ends 520 (twelve tubes shown for a six-zone injector) located within the gas dispersion cavities. Each pair of inlet tubes are connected together externally to a single gas control manifold and valve to form a controlled six-zone (or n-zone with n=1,2,3, . . . ) process gas injector.

Materials that work well to form dielectric plate 504 and modified showerhead 506 are numerous. However, certain materials are particularly preferred for the present embodiment. These materials include boron nitride, aluminum nitride and aluminum oxide. The reasons why these materials (e.g., AlN and BN) are preferable are discussed briefly to explain their advantages.

Boron nitride (BN) is highly refractory material with physical and chemical properties similar to carbon. Graphite-like (g-BN), wurzite (w-BN) and zinc blend (z-BN) are known polymorphs of BN corresponding to the graphite (hexagonal) and diamond (cubic) structures. Transformation of g-BN to w-BN occurs at pressures above 12 GPa at relatively low temperature (230° C). Transformation of w-BN to z-BN occurs above 1300° C. and pressures above 5.5 GPa. Zinc blend (z-BN) is stable above 5.5 GPa and from 1100° to 1500° C.

All forms of BN are good electrical insulators, possessing band gaps of several electron volts (eV); electrical resistance of the hexagonal from varies from $1.7 \times 10^{13}$ ohm-cm at 25° C. to $3 \times 10^4$ ohm-cm at 1000° C. and is little affected by frequency. The dielectric constant of hexagonal BN is 3 with the electric vector parallel to the oasal plane and 5 perpendicular to the plane. Consistent with the short interatomic distances and light atomic weights, all forms of BN are very good thermal conductors. Boron nitride is chemically inert in most environments, resisting attack by mineral acids or wetting by glasses, slags and molten oxides, cryolite and fused salts, and most molten metals including aluminum. Its rate of oxidation in air is negligible below 1100° C.

Hexagonal boron nitride is commonly synthesized as a fine powder. Powders will vary in crystal size, agglomerate size, purity (including percent residual $B_2O_3$) and density. BN powders can be used as mold release agents, high temperature lubricants, and additives in oils, rubbers and epoxies to improve thermal conductance of dielectric compounds. Powders also are used in metal- and ceramic-matrix composites to improve thermal shock and modify wetting characteristics.

Hexagonal boron nitride may be hot pressed into soft (Mohs 2) and easily machinable, white or ivory billets having densities 90–95% of theoretical value(2.25 g/cm³). Thermal conductivities of 17–58 W/m-K and CTEs of $0.4-5 \times 10^{-6}/°$ C. are obtained, depending on density, orientation with respect to pressing direction and amount of boric oxide binder phase. Because of its porosity and relatively low elastic modulus (50–75 GPa), hot pressed boron nitride has outstanding thermal shock resistance and fair toughness. Pyrolytic boron nitride, produced by chemical vapor deposition on heated substrates, also is hexagonal; the process is used to produce coatings and shapes having thin cross sections.

Cubic boron nitride is second in hardness only to diamond. It is used for high-performance tool bits and in special grinding applications. Cubic BN tooling typically outlasts alumina and carbide tooling and is preferred in applications where diamond is not appropriate, such as grinding of ferrous metals. Aluminum Nitride (AlN) has a molecular weight of 40.99, density of 3.26 g/cm³, CTE of $4.6 \times 10^{-6}/°$ C., m.p. of 2200° C. under 4 atm of $N_2$, and sublimes at 1 atm. AlN has a white, hexagonal crystal structure and its powder hydrolyses on contact with water or water vapor. Water-resistant powders that allow aqueous processing are commercially available. AlN is stable against acids and only slightly reacts with bases. It is made by reacting aluminum metal with nitrogen, by reduction of aluminum oxide with carbon in the presence of nitrogen or ammonia, or by decomposition of the product of reaction between aluminum trichloride and ammonia. AlN powder may be sintered to full density above 1800° C. in 1 atm of $N_2$ with the addition of sintering aids such as $Y_2O_3$ or CaO. Thermal conductivity in excess of 200 W/mK can be achieved in sintered parts, which is five times that of aluminum oxide. The dielectric strength of AlN is 1.5 times that of aluminum oxide, and electrical resistivity and mechanical strength are comparable to that of aluminum oxide. Its dielectric constant is about half that of aluminum oxide. Major applications include thermally conductive substrates and heat sinks for semiconductors, automotive and transit power modules, mobile communications and multichip modules. Other properties of AlN appear in the following table.

| | Properties of Aluminum Nitride Units | AlN |
|---|---|---|
| Volume resistivity | ohm-cm | $\geq 10^{14}$ |
| Dielectric constant | RT-1 MHz | 8.6 |
| Dielectric loss | RT-1 MHz | 0.0005 |
| Thermal conductivity | W/mK | 170 |
| Temperature coeff. of expansion RT-400° C. | $10^{-6}/°$ C. | 4.7 |
| Density | g/cm$^3$ | 3.3 |
| Hardness (Knoop) | GPa | 11.8 |
| Bending strength | MPa | 276 |
| Youngs modulus | GPa | 331 |
| Poisson ratio | | 0.25 |
| Fracture toughness via chevron notch shorbar technique | MPa$\sqrt{m}$ | 3.44 |

Figure 22:
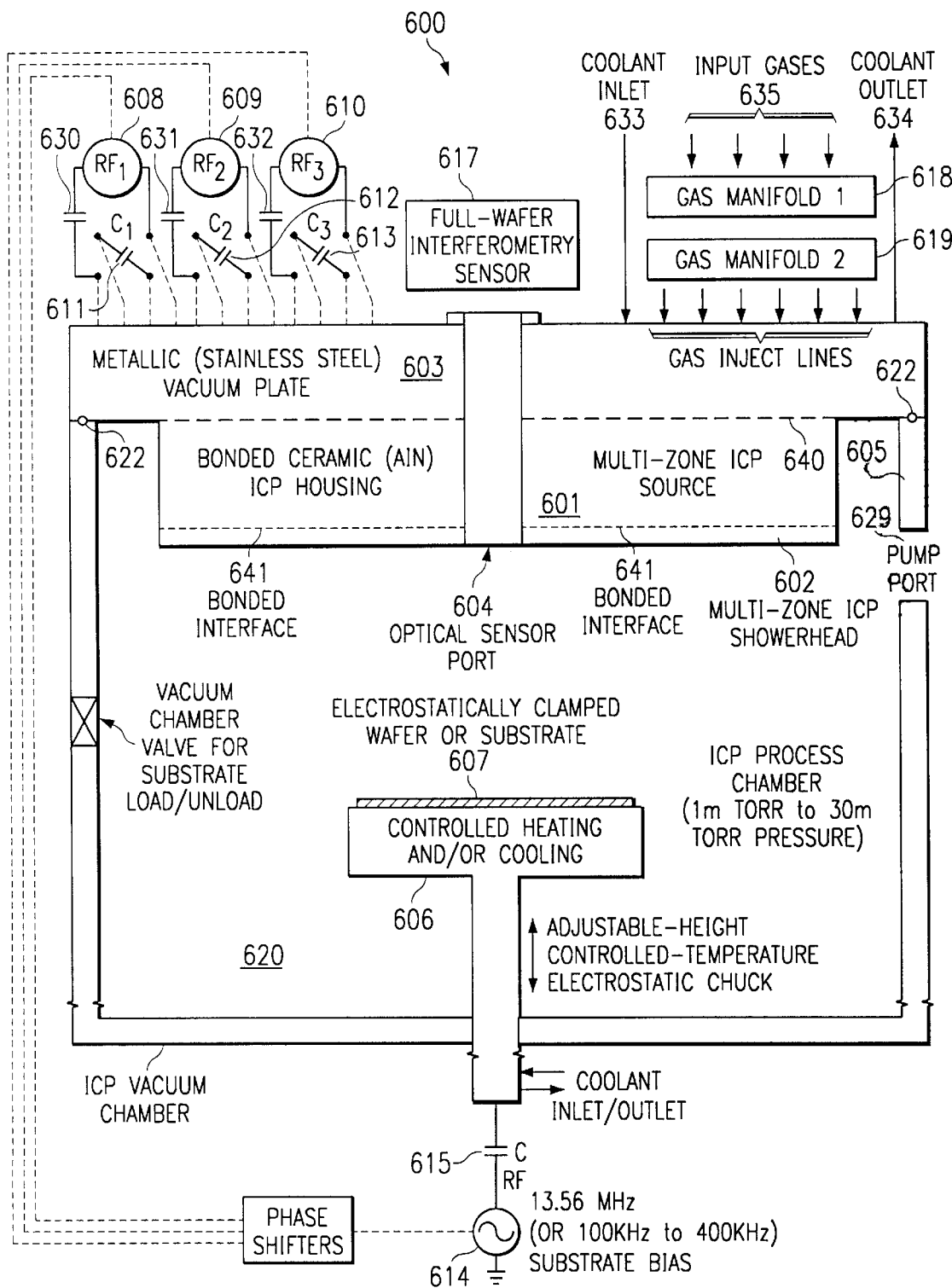
FIG. 22 shows the overall schematic view of a vacuum process chamber using the multi-zone ICP source structures of this invention (example shows a three-zone ICP configuration)

FIG. 22 demonstrates the schematic diagram of a plasma equipment process chamber 600 comprising one of the multi-zone ICP structures of this invention. The particular example shown in FIG. 22 shows a three-zone configuration in conjunction with three RF power supplies for the ICP source structure. The multi-zone ICP source structure 601 employs a hermetically bonded structure of dielectric plates (e.g., made of a ceramic material with relatively high thermal conductivity) containing the ICP antenna coils and gas showerhead dispersion cavities (not shown). The ICP housing 601 is also hermetically bonded and sealed to the metallic vacuum plate or flange 603. The vacuum plate or flange 603 is placed onto the plasma equipment process chamber 605 and established chamber vacuum using vacuum seal 622. This configuration places the multi-zone ICP housing on the vacuum side 620 of the process chamber 605. The ICP source 601 provides a vacuum-sealed optical (e.g., sapphire or quartz) plug or viewport 604 for real-time in-situ process monitoring and control purposes by monitoring the plasma process side 620 and/or substrate 607 state parameters. For instance, FIG. 22 shows a full wafer interferometry sensor 617 mounted on top of the optical plug 604 for real-time in-situ monitoring and control of the plasma process uniformity on the substrate 607. Other in-situ sensors such as plasma emission sensors and spatially resolved plasma emission sensors may also be used for process monitoring and control purposes.

The multi-zone ICP source 601 is positioned over a chuck 606 supporting the substrate 607 to be processed. Preferably, chuck 606 controls the substrate 607 temperature by controlled heating and/or cooling during the plasma process. The substrate 607 is preferably clamped to the temperature-controlled chuck 606 either by electrostatic or mechanical means. Moreover, the chuck 606 preferably has a capability for up/down movement and height adjustment with respect to the ICP source housing 601. This will provide a very useful capability for adjusting the ICP source to substrate spacing in order to optimize the plasma process parameters such as process uniformity while maintaining sufficient process throughput. For instance, reducing the ICP source to substrate spacing results in increased plasma density and ion current density at the wafer, causing enhanced plasma process rate. If the ICP source to substrate spacing becomes too small, the process uniformity may degrade and there may also be additional problems associated with plasma-induced device damage and excessive eddy-current heating of the substrate 607.

The plasma process chamber provides a vacuum chamber access valve for automated loading and unloading of the substrate 607 into and out of the vacuum process chamber 605. Moreover, the plasma process chamber 605 connects to a vacuum pump (e.g., turbo pump and/or mechanical pump) via pump port 629.

The chuck 606 preferably provides an option for electrical biasing (e.g., 13.56 MHZ RF or 100 kHz–400 KHz AC power supply) of the substrate 607 via power supply 614 and coupling capacitor 615. This electrical bias provides a good control over the plasma ion energy impacting the substrate 607.

FIG. 22 shows a three-zone ICP configuration with the outer zone, middle zone, and inner zone powered by the RF power supplies $RF_1$ (608), $RF_2$ (609), and $RF_3$ (610), respectively. As shown in this FIGURE, the RF power supplies are connected to the ICP antenna zones, preferably via series blocking capacitors 630, 631, and 632. Moreover, external inter-segment series capacitors $C_1$ (611), $C_2$ (612), and $C_3$ (613) connect the antenna segments in series within each zone (outer zone, middle zone, and inner zone, respectively). These series capacitors ensure reduced induced RF voltages within various zones, resulting in improved inductive plasma coupling and reduced parasitic capacitive coupling of the energy source to the plasma medium. The multi-zone ICP 601 RF power supplies (608, 609, 610) may employ source frequencies over a wide range (e.g., 1 MHZ to over 30 MHZ), and preferably a fixed 13.56 MHZ frequency. Moreover, these multi-zone power supplies may use external RF matching networks (not shown in FIG. 22) placed between the RF power supplies and the ICP antenna zones for improved load matching, improved RF power coupling, and improved plasma process repeatability. The RF power supplies may also employ phase shifters 616 in order to control the phase angles among various RF power supplies for improved process uniformity and repeatability.

The phase shifters 616 become non-essential when the power supplies use different frequencies. For instance, if a 100 kHz power supply is used for the substrate bias and three 13.56 MHZ RF power supplies are employed for powering the multi-zone ICP antenna, there is no need for a phase shifter between the substrate power supply and the multi-zone ICP power supplies. The ICP RF power supplies, however, may employ phase shifters/controllers to control the phase angles for $RF_1$ (608), $RF_2$ (609), and $RF_3$ (610).

FIG. 22 also shows the coolant inlet 633 and coolant outlet 634 lines for flowing the coolant (e.g., cooling water)

through the metallic vacuum lid. Due to the hermetically sealed bonded structure of the ICP source with the thermally conductive bonded/sealed interfaces 640 (between the top dielectric plate and the metallic vacuum lid) and 641 (between the lower and upper dielectric or ceramic plates), the cooled metallic vacuum plate/lid also serves as an effective heat removal or heat sink medium for the ICP housing. This will ensure that the ICP housing temperature with maximum RF power levels running through the antenna segments will remain well below 100° C.

As shown in FIG. 22, the ICP process gases 635 are fed to the ICP showerhead plate 602 via the gas manifolds 618 and 619. The external manifolding of the ICP gas lines can be designed to meet the specific plasma process uniformity and defect density requirements. The gas injection system can be set up for either single-zone or multi-zone gas injection (a two-zone injection using two gas manifolds is shown in FIG. 22).

Figure 23:
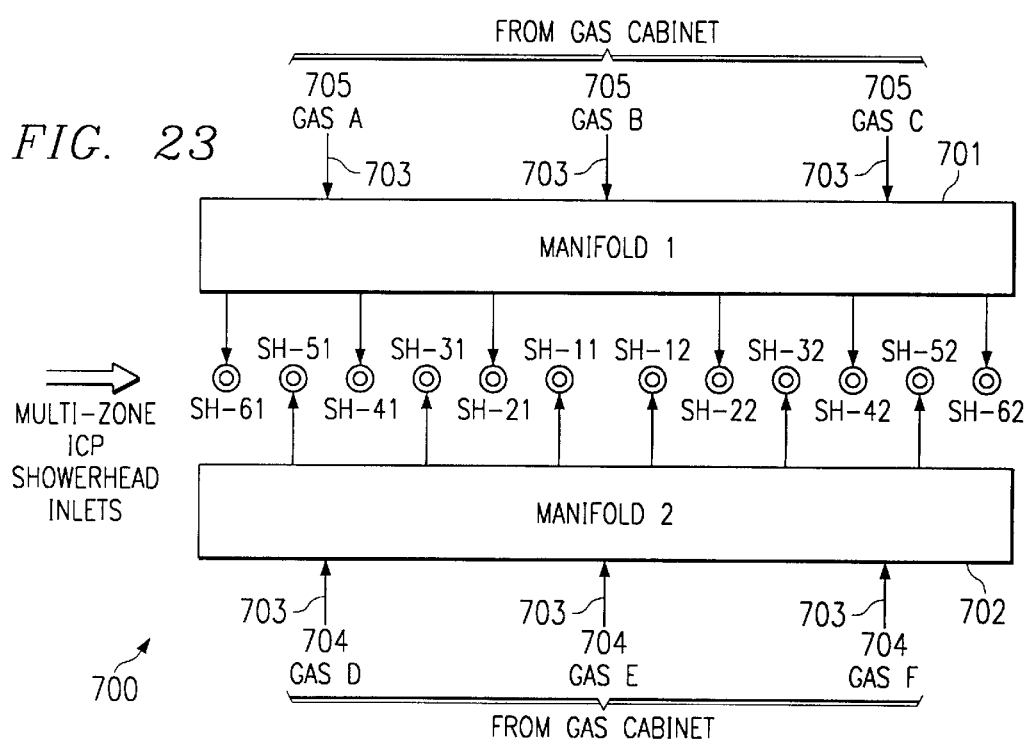
FIG. 23 illustrates the schematic diagram of a two-manifold gas distribution arrangement for the ICP source of FIG. 17 where the input gases are partitioned into two groups.

FIG. 23 shows an example of a two-manifold gas injection configuration 700 used with the multi-zone ICP source structures of this invention. FIG. 23 shows six pairs of gas inlet lines 703 for the multi-zone ICP source. The schematic diagram of FIG. 23 also shows up to six different process gases 704 and 705 coming from the ICP equipment gas box. The multi-zone ICP source dispersion cavities employ one pair of inlets for each gas dispersion cavity corresponding to each gas injection ring of holes in the showerhead. For instance, SH-61 and SH-62 both connect to the sixth (or outermost) gas dispersion cavity in the multi-zone ICP source structure while the inlet lines SH-11 and SH-12 both connect to the first (or innermost) gas dispersion cavity. As shown in the example of FIG. 23, process gases A, B and C (705) are connected together via the first gas manifold 701 and subsequently inject into the showerhead injection rings 2, 4, and 6. On the other hand, process gases D, E, and F (704) are connected together using the second gas manifold 702 and subsequently inject into the plasma process chamber via the showerhead injection rings 1, 3 and 5 (SH-11/SH-12, SH-31/SH-32, and SH-51/SH-52 inlets). This arrangement effectively configures the multi-zone ICP injector as a two-zone showerhead where premixing of the first group of process gases 705 and the second group of process gases 704 is prevented. It should be understood that other gas connection configurations and zone partitioning arrangements are possible for the multi-zone ICP structures of this invention.

Figure 24A:
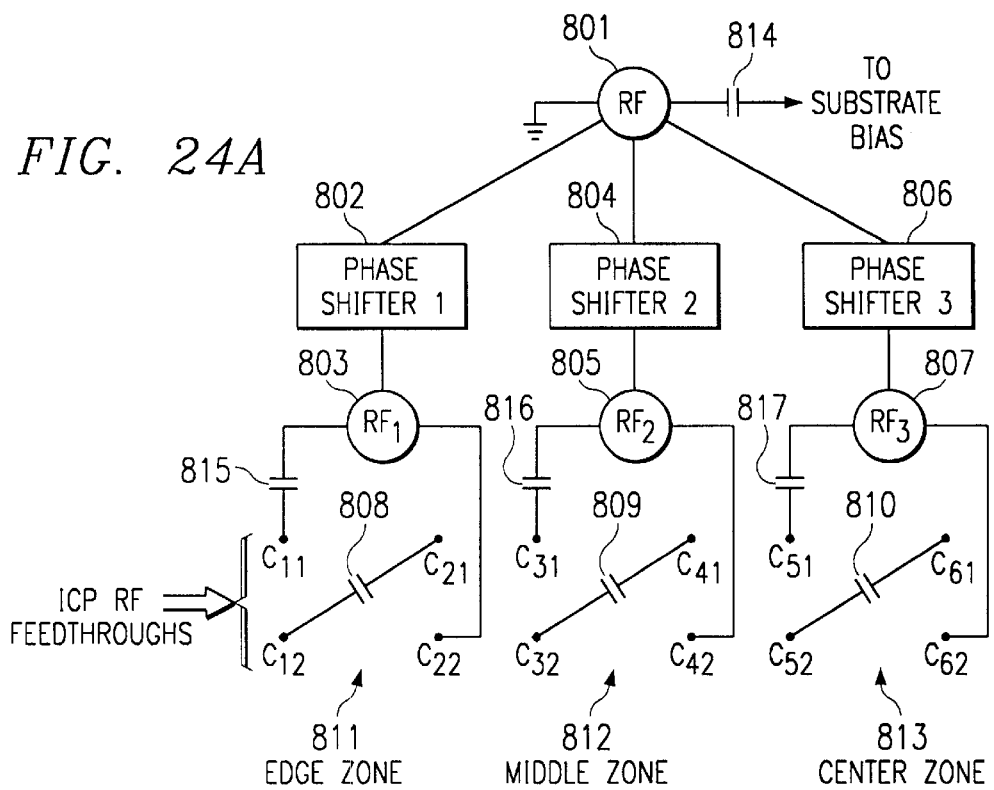
FIG. 24A shows a schematic electrical wiring diagram of a three-zone ICP configuration for the multi-zone ICP source of FIG. 17.
Figure 24B:
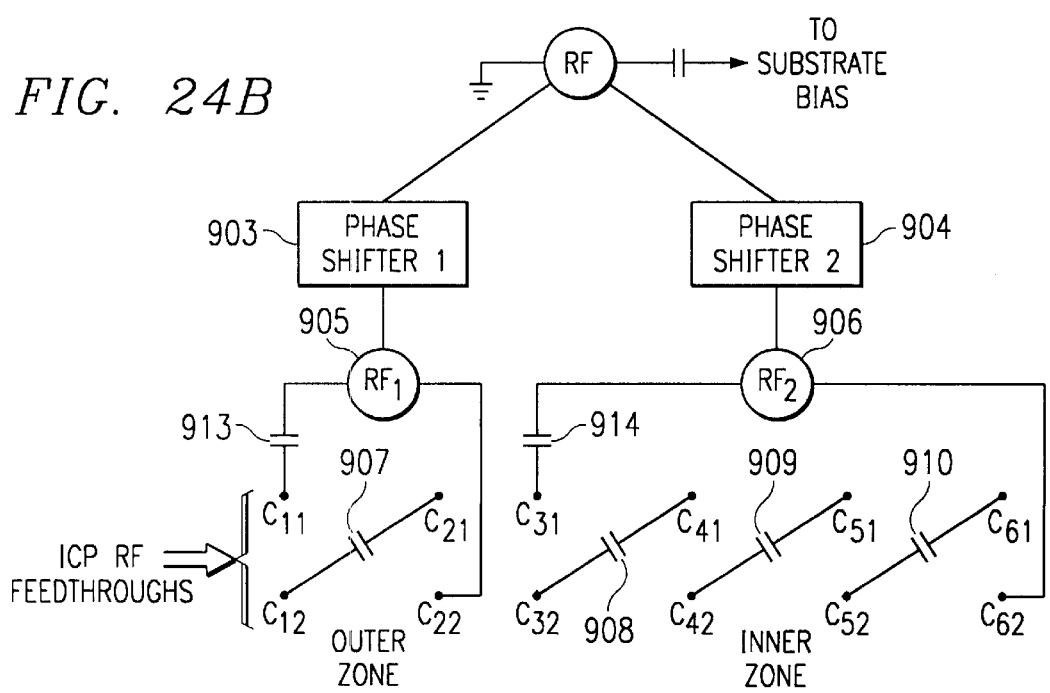
FIG. 24B shows a schematic electrical wiring diagram of a two-zone ICP configuration for the multi-zone ICP source of FIG. 17.

FIGS. 24A and 24B illustrate a three-zone and a two-zone ICP mixing arrangement, respectively, for one embodiment of this invention with six antenna segments. As shown in FIG. 24A, an RF power supply 801 is used to provide substrate bias via series or blocking capacitor 814. Moreover, the ICP antenna segments (six segments in this example) are externally partitioned and wired to form three ICP zones (edge zone 811, middle zone 812, and center zone 813). In edge zone 811, the outer two antenna segments (segments 1 and 2 with connector nodes $C_{11}/C_{12}$ and $C_{21}/C_{22}$) employ a series capacitor 808 to bridge the two segments. A first $RF_1$ power supply 803 connects to $C_{11}$ and $C_{22}$ via series blocking capacitor 815. The middle zone 812 is formed by bridging the third and fourth antenna segments using a series capacitor 809 placed between nodes $C_{32}$ and $C_{41}$. A second $RF_2$ power supply 805 powers the middle zone 812 via series blocking capacitor 816. Inner zone 813 is configured by combining the fifth and sixth antenna segments using a series capacitor 810 placed between nodes $C_{52}$ and $C_{61}$. A third $RF_3$ power supply 807 powers the inner zone via series blocking capacitor 817. Three phase shifters/controllers 802, 804, 806 may be used in order to control the relative phase angles of various RF power supplies for process uniformity and repeatability. For a given multi-zone ICP source structure, various types of ICP antenna segment partitioning may be used for a given number of zones. In the example shown in FIG. 24A, each antenna zone has received two adjacent antenna segments. The optimum partitioning configuration should provide the best amount of control over plasma process uniformity.

FIG. 24B illustrates a two-zone ICP arrangement wherein the outer zone is formed by grouping the first and second antenna segments while the inner zone is configured by grouping the third through sixth antenna segments. The outer zone employs a series capacitor between nodes $C_{12}$ and $C_{21}$ in conjunction with a first $RF_1$ power supply 905 connected to nodes $C_{11}$ and $C_{22}$ via a series blocking capacitor 913. The inner zone utilizes series capacitors 908 (between nodes $C_{32}$ and $C_{41}$), 909 (between nodes $C_{42}$ and $C_{51}$) and 910 (between nodes $C_{52}$ and $C_{61}$). A second $RF_2$ power supply 906 connects to inner zone nodes $C_{31}$ and $C_{12}$ via series blocking capacitor 914. An RF power supply 901 connects to the plasma equipment chuck via series blocking capacitor 902 in order to produce substrate RF bias. Phase shifters/controllers 903 and 904 may be used in order to control the relative phase angles of various RF power supplies.

One important advantage of the multi-zone ICP structures and methods of this invention is that for any given source structure numerous multi-zone wiring arrangements and antenna segment partitioning configurations are possible simply by changing the electrical wiring external to the source. Therefore, this invention provides a significant amount of flexibility for optimizing the multi-zone ICP source zoning and partitioning in order to establish the widest possible plasma process window and the best process uniformity. Moreover, the multi-zone ICP source structures and methods of this invention are scalable to allow uniform processing of larger substrates such as 300-mm silicon wafers and large-area flat-panel display substrates.

The hermetic sealing fabrication method preferably used for fabrication of the multi-zone ICP source structures of this invention result in extremely high vacuum integrity, ultra-high vacuum (UHV) compatibility, and ultra-clean plasma processing. For instance, the multi-zone ICP source structures of this invention are compatible with vacuum base pressures as low as $5 \times 10^{-9}$ Torr and better.

For a given multi-zone ICP source structure and a specified process application, the optimum zoning and antenna segment partitioning (or grouping) between the antenna zones can be obtained by performing a series of Design-of-Experiments (DOE) with various external wiring configurations. The multi-zone ICP series capacitors are selected to minimize the antenna RF voltages within various zones depending on the RF frequency.

In most practical plasma process applications, the multi-zone ICP structures of this invention can meet the process requirements using a two-zone or a three-zone configuration (e.g., two-zone configuration for up to 200-mm wafer processing). Larger substrates (e.g., 300-mm silicon wafers) may benefit from a higher number of zones. A multi-variable real-time controller may be used in conjunction with a suitable sensor (e.g., a full-wafer interferometry sensor) in order to control the process uniformity and repeatability.

The multi-zone ICP structures of this invention may employ either straight lined-up electrical connection feedthroughs for the ICP antenna segments (as described and shown for various embodiments) or they may utilize staggered electrical feedthroughs in order to prevent any possible plasma process non-uniformities associated with the lined up segment ring breaks in a non-staggered arrangement. For instance, for a multi-zone ICP structure with eight circular antenna segments, one type of design may employ eight pairs of electrical feedthrough connector leads lined up along two straight (nearly radial) lines extending between the center and edge regions of the ICP housing. In this design, there may be some plasma density non-uniformity directly underneath the source (and very close to the source) and between the two segment feedthrough lines. This possible non-uniformity can be produced due to the break in the current flow through each broken antenna segment ring and due to the cumulative non-uniformity effects of the non-staggered or straight lined-up feedthroughs. On the other hand, the eight pairs of feedthroughs for eight broken ring antenna segments can be staggered at, for instance, 40° to 45° for each pair of adjacent segments in order to utilize the full 360° planar staggering of the feedthroughs in a spiral pattern. This will eliminate the possible cumulative non-uniformity effects of various antenna segment breaks and associated feedthroughs. Thus, the minimum allowable ICP source-to-substrate spacing for acceptable plasma process uniformity is smaller in the case of staggered electrical feedthroughs (e.g., spiral staggered feedthrough pattern) compared to the non-staggered feedthrough pattern.

Due to the proximity of the gas dispersion cavities to the multi-zone antenna segments in various ICP embodiments of this invention, there is a possibility of plasma formation within the gas dispersion cavities. This possible plasma formation in the gas dispersion cavities can be avoided by various means and techniques. One method is to fill the gas dispersion cavities with a suitable ceramic fiber or ceramic powder (e.g., with controlled spherical ceramic particle size). Filling the gas dispersion cavities with a ceramic powder or a ceramic filler can be performed prior to final assembly and hermetic bonding of the multi-zone ICP source structure.

Figure 25A:
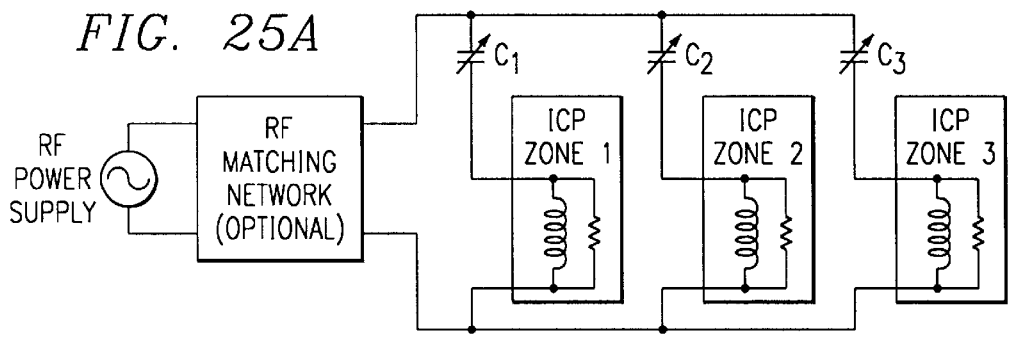
FIG. 25A shows a schematic electrical wiring diagram of a three-zone ICP configuration for a single RF power supply based on an adjustable capacitor array.
Figure 25B:
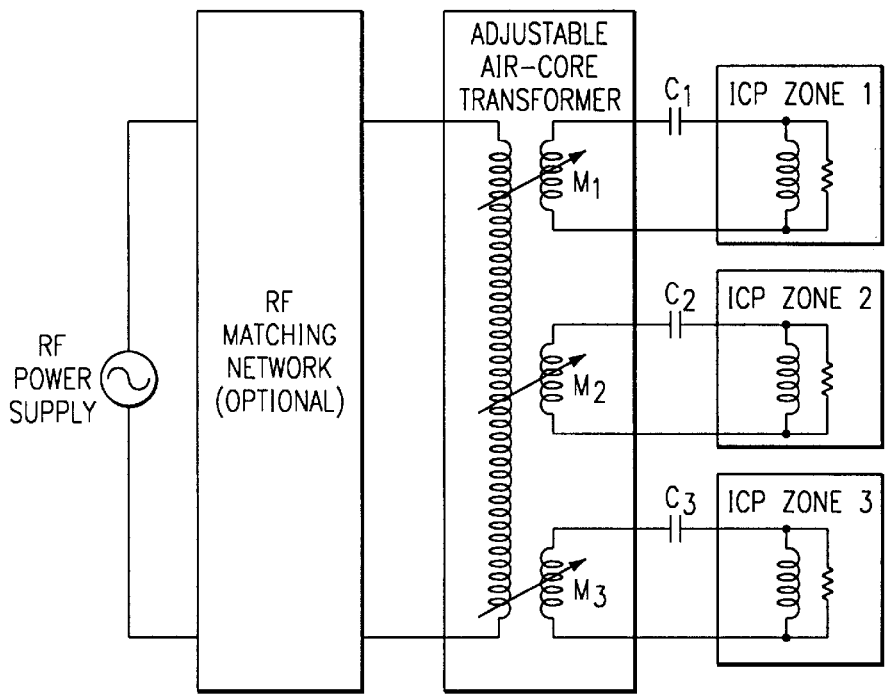
FIG. 25B shows a schematic electrical wiring diagram of a three-zone ICP configuration for a single RF power supply based on an adjustable air-core transformer.

The multi-zone ICP source structures of the present invention may use separate RF power supplies and dedicated matching networks for each of the ICP antenna zones (e.g., three RF power supplies and three RF matching networks for a 3-zone ICP source wiring arrangement). Another method, however, is to electrically wire the zones in parallel with either a fixed capacitor or a variable capacitor connected in series with each of the zones in order to adjust the effective load impedance and electrical current associated with each zone. Another possibility is to use adjustable (e.g., mechanically adjustable with server or stepper motors) transformer couplings for various zones with a single transformer primary coil attached to a single RF power supply and a single RF matching network (RF matching network may not be needed). These possible arrangements allow effective real-time multi-zone ICP plasma uniformity control with a single RF power supply, resulting in reduced system cost and complexity. FIGS. 25A and 25B show examples of two power supply wiring arrangements enabling 3-zone ICP operation and control using a single RF power supply. FIG. 25A shows a parallel capacitive wiring arrangement while FIG. 25B demonstrates an adjustable transformer coupling configuration allowing multi-zone operation. A real-time multi-variable controller will provide control signals for the stepper or servo motors controlling the variable capacitor valves or the extent of transformer coupling ratios. For instance, a multi-variable real-time controller will adjust the multi-zone transformer coupling ratios $M_1$, $M_2$, and $M_3$ for real-time multi-zone uniformity control.

The present invention also proposes a hermetic sealing fabrication process for construction of various planar single-zone and multi-zone source structures for various plasma processing applications. The hermetic sealing fabrication process of this invention eliminates the need for elastomer-ring seals for the ICP source assembly, resulting in improved vacuum integrity (i.e., reduced plasma chamber vacuum base pressure and reduced leak-back rate), improved process cleanliness, and increased source lifetime. Polymer-based vacuum seals such as elastomer O-ring seals tend to degrade over time particularly in presence of plasma and/or heat.

Figure 26:
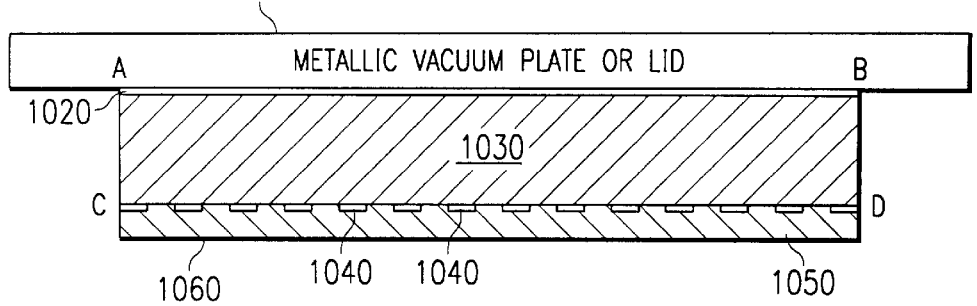
FIG. 26 shows a schematic diagram of a planar ICP source assembly according to one hermetic sealing fabrication method of the present invention.

The preferred fabrication method of this invention employs a thermal bonding or brazing process for final assembly of the source structure. For instance, the preferred fabrication method of this invention is briefly described for the fourth multi-zone source structure of this invention employing a metallic vacuum plate or vacuum lid and two dielectric plates. As shown in FIG. 26, ICP source structure 1000 comprises vacuum lid/plate 1010, upper dielectric plate 1030, and lower dielectric plate 1050. Vacuum lid/plate 1010 can support the entire ICP housing, provide the process gas inlets and electrical feedthroughs (not shown here), and serve as a cooling medium for the ICP source housing during operation. Upper dielectric plate 1030 is preferably made of a high thermal conductivity ceramic material such as aluminum nitride (AlN) which provides a medium for hermetic sealing of various process gas inlets and electrical feedthroughs. Upper dielectric plate 1010 serves to separate the ICP antenna structure from the metallic (e.g., stainless steel) cooled base plate 1010 for effective inductive RF coupling to the plasma medium, to contain the gas dispersion cavities, and as a heat transfer medium for effective cooling of the ICP antenna structure (located at the bottom of this upper dielectric plate 1030) during the ICP source operation. Lower dielectric plate 1050 preferably holds the ICP antenna structure and the gas injection holes that communicate with the gas dispersion cavities in the upper dielectric plate 1030. Lower dielectric plate 1050 is also preferably made of a high thermal conductivity ceramic material such as AlN.

A preferred ICP source fabrication process flow is now described. Referring to FIG. 26, the metallic vacuum plate/lid 1010 is separately manufactured using a suitable material such as stainless steel (or aluminum). Preferably, stainless steel is used for fabrication of vacuum plate 1010 for ultra-high vacuum (UHV) applications requiring extremely low vacuum base pressures. Vacuum plate 1010 holds the embedded coolant channels for running a coolant (e.g., water) flow as well as various through holes for passage of the metallic rods connecting to the antenna segments as well as the process gas inlet tubes. The bottom surface of vacuum plate 1010 is highly polished in order to provide a suitable area for a subsequent hermetic bonding or brazing process. The lower or bottom surface of the stainless steel vacuum lid/plate 1010 (corresponding to the ICP housing area) is then coated with a suitable thermal bonding or brazing material (e.g., tin, indium or a suitable alloy) by sputtering or electroplating.

The upper dielectric (e.g., AlN or ceramic) plate 1030 is also separately fabricated along with various embedded gas dispersion channels positioned on its bottom surface as well as all the necessary through holes for tight (e.g., shrink fit) insertion of the process gas feed lines and the antenna connector rods. For instance, for a multi-zone ICP source with six antenna segments and six gas dispersion cavities, upper dielectric plate 1030 may contain twelve holes for tight fit insertion of six pairs of electrical connector rods and another six pairs of holes for tight fit insertion of six pairs of stainless steel gas inlet tubes. For instance, if the electrical connector rods and gas inlet tubes all have 0.25 inch external diameters, the lower dielectric plate 1050 should have twenty-four through holes with each through hole having a diameter of 0.25 inch. The inner sidewalls of the through holes, the top surface, and select areas on the bottom surface of the upper dielectric plate 1030 are coated with a suitable hermetic thermal bonding material such as indium, tin, or a suitable metallic alloy with a relatively low (e.g., $\leq 400°$ C.) melting point. This coating process may be performed by plasma sputtering, evaporation, or electroplating.

Similarly, the external surfaces of the electrical connector rods and gas line tube sections are also coated with the same thermal bonding or brazing material (e.g., indium, tin, or a suitable metallic alloy) using a suitable material deposition process (plasma sputtering, vaporization, electroplating, or other process). Subsequently, the electrical connector rods and gas inlet tube sections are cooled (e.g., in liquid nitrogen) and rapidly inserted into the respective through holes fabricated in the upper dielectric plate 1030.

Separately, the lower dielectric plate 1050 is fabricated along with the shallow trenches on its top surface for insertion of antenna segment broken rings and through gas injection holes. The broken ring antenna segments may be formed by filling the shallow trenches with a suitable metal such as aluminum or copper using one or a combination of physical-vapor deposition (e.g., plasma sputtering) and electroplating processes. An alternative method is to separately form the individual antenna segments (e.g., by machining or stamping) and subsequently insert them in their respective trenches on the lower dielectric plate 1050 to be permanently sandwiched between the two dielectric plates 1030 and 1050 during the final assembly. Select areas of the top surface of the lower dielectric plate 1050 (for instance, continuous narrow rings, one near the edge of the ICP dielectric housing, and additional narrow rings located between the adjacent antenna segments and not overlapping with the positions of the gas dispersion cavities in the upper dielectric plate 1030 after the final assembly) are also coated with the thermal bonding or brazing material (indium, tin, or a suitable metallic alloy).

Subsequently, the ICP source assembly comprising the metallic vacuum plate 1010, upper dielectric plate 1030 with all associated electrical rods and gas tubes, and the lower dielectric plate 1050 along with the ICP antenna segments placed in the designated shallow trenches, is assembled and temporarily held together by mechanical clamping of the assembled structure. Assembling the ICP source is performed by first bringing the metallic vacuum plate 1010 and top dielectric plate 1030 together and feeding the ends of the electrical rods and gas tube lines tightly attached to the upper dielectric plate 1030 through the respective larger diameter through holes formed in the vacuum plate 1010.

This will allow the bottom surface of the vacuum plate 1010 to come into a clean planar contact with the top surface of the upper dielectric plate 1030. Both these surfaces are covered with the bonding material (indium, tin, or another material) through the entire interface contact region 1020 shown between points A and B in the cross-sectional view of FIG. 26 (for simplicity, FIG. 26 does not show structural details such as the rods or tubes). Then, the lower dielectric plate 1050 is brought into contact with the upper dielectric plate 1030, sandwiching the antenna segments (not shown in FIG. 26) between them.

FIG. 26 also shows a cross-sectional view of the circular rings of the bonding material coating layers 1040 (shown as multiple lines between points C and D) on the bottom surface of upper dielectric plate 1030 and on the top surface of lower dielectric plate 1050 (the top and bottom coating patterns are mirror images of each other).

After mechanical clamping of the entire structure, the mechanically clamped assembly is placed inside a vacuum or purged thermal furnace and heated to an appropriate temperature (e.g., up to 200° 0 300° C. for indium or tin bonding) and then cooled down and removed. This will result in thermal fusing of the assembled structure by formation of hermetically sealed bonded junctions wherever the bonding material coatings have been in contact. For instance, hermetically sealed bonded junctions are formed as bonded interface region 1020 between the ICP housing top dielectric plate 1030 and metallic vacuum plate/lid 1010, as well as in the continuous rings 1040 at the interface between the upper dielectric plate 1030 and lower dielectric plate 1050. Moreover, this thermal anneal process will form hermetically sealed junctions between the electrical rods and their respective support holes as well as between the gas inlet tubes and their respective support holes in the upper dielectric plate 1030. The temporary mechanical clamping device can then be removed. This process will result in a fully hermetically-sealed and self-supporting ICP source structure without any need for elastomer seals and without any need for permanent clamping brackets or screens. This hermetically-sealed ICP source can then be mounted on a plasma equipment process chamber using a conflat flange metal seal between the vacuum lid 1010 and the process chamber for vacuum integrity and process cleanliness.

The key advantages of the hermetic sealing fabrication process flow of this invention can be summarized as follows:

No elastomer seals resulting in improved process cleanliness, enhanced vacuum integrity, and improved source lifetime.

Hermetically sealed bonded junctions provide low-thermal resistance heat transfer junctions, allowing cooling of the ICP housing by the cooled vacuum plate 1010.

Hermetically sealed structure eliminates the possibility of any outgassing and/or virtual leak surfaces/junction resulting in improved vacuum integrity and process cleanliness.

Hermetical sealing fabrication process flow is applicable to various single-zone and multi-zone planar ICP designs of this invention and prior art structures.

The hermetical sealing fabrication process flow results in reduced cost-of-ownership for ICP-based plasma processing while enabling high-performance plasma processing. This is due to extended ICP source reliability, lifetime, and enhanced process cleanliness.

Although the invention has been described in detail herein with reference to the illustrative embodiments, it is to be understood that this description is by way of example only and is not to be construed in a limiting sense. It is to be further understood, therefore, that numerous changes in the details of the embodiments of the invention and additional embodiments of the invention, will be apparent to, and may be made by, persons of ordinary skill in the art having reference to this description. It is contemplated that all such changes and additional embodiments are within the spirit and true scope of the invention as claimed below.

What is claimed is:

1. A hermetically-sealed inductively-coupled plasma (ICP) source structure, comprising.

a dielectric housing an inductively-coupled source antenna integral to said dielectric housing;

a source support plate contacting said dielectric housing; and a hermetically-sealed junction formed between said dielectric housing; and said source support plate, wherein said hermetically sealed junction is formed by thermal bonding process and wherein said hermetically sealed junction is formed over entire area of said source plate.

2. The hermetically sealed ICP source structure of claim 1 wherein said thermal bonding process comprises an alloy with a melting point T $\leq$ 600 ° C.

3. The hermetically-sealed ICP source structure of claim 1 wherein said hermetically-sealed junction is formed by a thermal brazing process.

4. The hermetically-sealed ICP source structure of claim 1 wherein said dielectric housing is made of a high thermal conductivity ceramic material.

5. The hermetically-sealed ICP source structure of claim 1 wherein said dielectric housing comprises aluminum nitride.

6. The hermetically-sealed ICP source structure of claim 1 wherein said dielectric housing comprises a high-thermal-conductivity vacuum-compatible polymer-based material.

7. The hermetically-sealed ICP source structure of claim 1 wherein said dielectric housing comprises at least one dielectric plate.

8. The hermetically-sealed ICP source structure of claim 7 wherein said dielectric housing comprises a lower dielectric plate and an upper dielectric plate.

9. The hermetically-sealed ICP source structure of claim 8 wherein said upper dielectric plate coupled to said lower dielectric plates such that said inductively-coupled source antenna is held between the lower dielectric plate and the upper dielectric plate.

10. The hermetically-sealed ICP source structure of claim 8 wherein said lower dielectric plate couples to said upper dielectric plates using at least one hermetically-sealed contact junction.

11. The hermetically-sealed ICP source structure of claim 10 wherein said at least one hermetically sealed contact junction between said lower dielectric plate and said upper dielectric plate is formed using a thermal bonding process to bond said lower dielectric plate to said upper dielectric plate.

12. The hermetically-sealed ICP source structure of claim 11 wherein the thermal bonding process comprises an alloy with a melting point $\leq$ 600° C.

13. The hermetically-sealed ICP source structure of claim 12 wherein the low melting point bonding alloy comprises indium.

14. The hermetically-sealed ICP source structure of claim 10 wherein said at least one hermetically-sealed contact junction between said lower dielectric plate and said upper dielectric plate is formed using a thermal brazing process.

15. The hermetically-sealed ICP source structure of claim 10 wherein said upper dielectric plate further comprises a plurality of feedthroughs operable to provide electrical connections to said source antenna.

16. The hermetically-sealed ICP source structure of claim 15 wherein said electrical connections are hermetically sealed to said the plurality of upper dielectric plate feedthroughs.

17. The hermetically-sealed ICP source structure of claim 16 wherein said hermetical sealing of said electrical connections comprises thermal bonding.

18. The hermetically-sealed ICP source structure of claim 15 wherein said upper dielectric plate further comprises at least one feedthrough operable to receive a process gas inlet tube.

19. The hermetically-sealed ICP source structure of claim 18 wherein each process gas inlet tube is hermetically sealed to said at least one feedthrough operable to receive a process gas inlet tube.

20. The hermetically-sealed ICP source structure of claim 18 wherein said hermetical sealing of said feedthrough to said inlet process gas tube comprises thermal bonding.

21. The hermetically-sealed ICP source structure of claim 11 wherein said upper dielectric plate further comprises a plurality of embedded gas dispersion channels, said dispersion channels operable to direct process gas flow.

22. The hermetically-sealed ICP source structure of claim 1 wherein said source support plate comprises a stainless steel support plate.

23. The hermetically-sealed ICP source structure of claim 1 wherein said source support plate comprises an aluminum support plate.

24. The hermetically-sealed ICP source structure of claim 1 wherein said source support plate couples to a plasma process chamber to provides a vacuum seal interface to the plasma process chamber.

25. The hermetically-sealed ICP source structure of claim 1 wherein said ICP source is a single-zone ICP source.

26. The hermetically-sealed ICP source structure of claim 1 wherein said ICP source is a multi-zone ICP source.

27. The hermetically-sealed ICP source structure of claim 1 further comprising coolant channels formed within said support plate, said coolant channels operable to flow a coolant to cool said ICP source.

28. The hermetically-sealed ICP source structure of claim 1 wherein said support plate further comprises feedthroughs for electrical connections to said antenna and further to allow process gas flow into a plasma process chamber.

29. The hermetically-sealed ICP source structure of claim 1 wherein said ICP source is a substantially planar assembly comprising a substantially planar dielectric housing, a substantially planar source support plate, and a substantially planar hermetically sealed junction.

30. The hermetically-sealed ICP source structure of claim 9 wherein said source antenna is formed as a monolithic patterned layer by depositing an electrically conducting metallic layer onto a surface of the lower dielectric plate having trenches formed in the surface of the lower dielectric plate.

31. The hermetically-sealed ICP source structure of claim 9 wherein said source antenna is formed as a monolithic patterned layer by depositing an electrically conducting metallic layer onto a surface of the upper dielectric plate having trenches formed in the surface of the upper dielectric plate.

32. The hermetically-sealed ICP source structure of claim 1 wherein said source antenna is formed as a separate component and placed in designated trenches between said upper dielectric plate and said lower dielectric plate.

33. A hermetically-sealed multi-zone inductively-coupled plasma source, for producing a plasma medium comprising:

a first antenna structure for substantially inductive coupling of radio-frequency electrical power to said plasma medium;

at least one additional antenna structure for inductive coupling of additional radio-frequency electrical power to said plasma medium, wherein said first antenna structure and said at least one additional antenna structure are operated together for providing a substantially uniform plasma process on at least one substrate placed in a low-pressure plasma processing equipment;

a plurality of radio-frequency power supplies operable to supply power to said antenna structures;

a controller operable to control the plurality of radio frequency power supplies in order to provide a substantially uniform plasma process;

a dielectric housing, integrally including the inductively-coupled source antenna, said dielectric housing further comprising;

a lower dielectric plate; and an upper dielectric plate, wherein said upper dielectric plate couples to said lower dielectric plates such that said inductively-coupled source antenna is held between the lower dielectric plate and the upper dielectric plate, and further wherein said lower dielectric plate couples to said upper dielectric plates using at least one hermetically-sealed contact junction;

a source support plate contacting said dielectric housing; and a hermetically-sealed junction formed between said dielectric housing and said source support plate.

34. The hermetically-sealed ICP source structure of claim 1 wherein said hermetically-sealed junction is formed by fusing the said dielectric housing and said support plate.

35. The hermetically-sealed ICP source structure of claim 34 wherein fusing said dielectric housing and said support plate comprises brazing.

36. The hermetically-sealed ICP source structure of claim 1 wherein said hermetically-sealed junction is formed by an epoxy bond between said dielectric housing and said support plate.

37. The hermetically-sealed ICP source structure of claim 10 wherein said at least one hermetically-sealed contact junction between said lower dielectric plate and said upper dielectric plate is formed by fusing said lower dielectric plate to said upper dielectric plate.

38. The hermetically-sealed ICP source structure of claim 37 wherein fusing comprises brazing.

39. The hermetically-sealed ICP source structure of claim 38 wherein brazing comprises using indium.

40. The hermetically-sealed ICP source structure of claim 15 wherein said electrical connections are fused to said hermetically-sealed to said the plurality of upper dielectric feedthroughs.

41. The hermetically-sealed ICP source structure of claims 1 wherein said hermetically-sealed junction is formed using an alloy with a melting point <400° C.

42. The hermetically-sealed ICP source structure of claim 1 wherein said hermetically-sealed junction is formed using an alloy with a melting point <300° C.

43. The hermetically-sealed ICP source structure of claim 1, wherein the hermetically-sealed junction comprises a continuous interface along all the points on surface of the dielectric housing which contact a surface of the source support plate.

44. The hermetically-sealed ICP source structure of claim 1, wherein the source support plate is operable to be sealed to a process chamber using a hermetic seal.

45. The hermetically-sealed ICP source structure of claim 44, wherein the hermetic seal of between the process chamber to the hermetically-sealed ICP source structure is a metal-to-metal seal.

46. The hermetically-sealed ICP source structure of claim 1, wherein heat generated during plasma generation by the inductively-coupled source antenna is removed by direct heat transfer mechanism having a thermal conductivity greater than that of epoxy.

47. The hermetically-sealed ICP source structure of claim 46, wherein the direct heat transfer mechanism comprises a ceramic lower and upper dielectric plate with a thermal conductivity greater than that of epoxy.

* * * * *